US010065851B2

(12) United States Patent
Bryzek

(10) Patent No.: US 10,065,851 B2
(45) Date of Patent: Sep. 4, 2018

(54) MICROELECTROMECHANICAL PRESSURE SENSOR INCLUDING REFERENCE CAPACITOR

(75) Inventor: Janusz Bryzek, Oakland, CA (US)

(73) Assignee: Fairchild Semiconductor Corporation, Phoenix, AZ (US)

( * ) Notice: Subject to any disclaimer, the term of this patent is extended or adjusted under 35 U.S.C. 154(b) by 930 days.

(21) Appl. No.: 13/821,598

(22) PCT Filed: Sep. 20, 2011

(86) PCT No.: PCT/US2011/052369
§ 371 (c)(1),
(2), (4) Date: Jun. 19, 2013

(87) PCT Pub. No.: WO2012/040211
PCT Pub. Date: Mar. 29, 2012

(65) Prior Publication Data
US 2013/0277772 A1    Oct. 24, 2013

Related U.S. Application Data

(60) Provisional application No. 61/384,320, filed on Sep. 20, 2010.

(51) Int. Cl.
  *B81B 3/00* (2006.01)
  *B81C 1/00* (2006.01)
  (Continued)

(52) U.S. Cl.
  CPC ........ *B81B 3/0021* (2013.01); *B81C 1/00015* (2013.01); *B81C 1/00158* (2013.01);
  (Continued)

(58) Field of Classification Search
  CPC ... B81B 3/0021; B81C 1/00015; G01C 19/56; G01L 9/06; G01L 9/00; H05K 1/00
  See application file for complete search history.

(56) References Cited

U.S. PATENT DOCUMENTS

| 3,231,729 A | 1/1966 | Stern |
| 4,511,848 A | 4/1985 | Watson |

(Continued)

FOREIGN PATENT DOCUMENTS

| CN | 1068444 A | 1/1993 |
| CN | 1198587 A | 11/1998 |

(Continued)

OTHER PUBLICATIONS

U.S. Appl. No. 12/947,543 U.S. Pat. No. 8,421,168, filed Nov. 16, 2010, Microelectromechanical Systems Microphone Packaging Systems.

(Continued)

*Primary Examiner* — Julio J Maldonado
*Assistant Examiner* — Lawrence-Linh T Nguyen
(74) *Attorney, Agent, or Firm* — Brake Hughes Bellermann LLP

(57) ABSTRACT

This document discusses, among other things, an apparatus including a silicon die including a vibratory diaphragm, the die having a silicon die top opposite a silicon die bottom, with a top silicon die port extending from the silicon die top through the silicon die to a top of the vibratory diaphragm, and with a bottom silicon die port extending from the silicon die bottom to a bottom of the vibratory diaphragm, wherein the bottom silicon die port has a cross sectional area that is larger than a cross-sectional area of the top silicon die port, a capacitor electrode disposed along a bottom of the silicon die, across the bottom silicon die port, the capacitor electrode including a first signal generation portion that is coextensive with the top silicon die port, and a second signal generation portion surrounding the first portion.

20 Claims, 9 Drawing Sheets

(51) Int. Cl.
*G01L 9/00* (2006.01)
*G01L 19/04* (2006.01)

(52) U.S. Cl.
CPC .......... *G01L 9/0016* (2013.01); *G01L 9/0042* (2013.01); *G01L 9/0073* (2013.01); *G01L 19/04* (2013.01); *B81B 2201/0257* (2013.01); *B81B 2201/0264* (2013.01); *B81B 2207/012* (2013.01)

(56) References Cited

U.S. PATENT DOCUMENTS

| | | | |
|---|---|---|---|
| 4,896,156 A | 1/1990 | Garverick | |
| 5,424,650 A * | 6/1995 | Frick | G01D 5/2417 324/661 |
| 5,481,914 A | 1/1996 | Ward | |
| 5,487,305 A | 1/1996 | Ristic et al. | |
| 5,491,604 A | 2/1996 | Nguyen et al. | |
| 5,600,064 A | 2/1997 | Ward | |
| 5,656,778 A | 8/1997 | Roszhart | |
| 5,659,195 A | 8/1997 | Kaiser et al. | |
| 5,703,292 A | 12/1997 | Ward | |
| 5,723,790 A | 3/1998 | Andersson | |
| 5,751,154 A | 5/1998 | Tsugai | |
| 5,760,465 A | 6/1998 | Alcoe et al. | |
| 5,765,046 A | 6/1998 | Watanabe et al. | |
| 5,894,091 A | 4/1999 | Kubota | |
| 5,912,499 A | 6/1999 | Diem et al. | |
| 5,992,233 A | 11/1999 | Clark | |
| 6,131,457 A | 10/2000 | Sato | |
| 6,214,644 B1 | 4/2001 | Glenn | |
| 6,230,566 B1 | 5/2001 | Lee et al. | |
| 6,236,096 B1 | 5/2001 | Chang et al. | |
| 6,250,157 B1 | 6/2001 | Touge | |
| 6,253,612 B1 | 7/2001 | Lemkin et al. | |
| 6,301,965 B1 | 10/2001 | Chu et al. | |
| 6,351,996 B1 | 3/2002 | Nasiri et al. | |
| 6,366,468 B1 | 4/2002 | Pan | |
| 6,370,937 B2 | 4/2002 | Hsu | |
| 6,390,905 B1 | 5/2002 | Korovin et al. | |
| 6,501,282 B1 | 12/2002 | Dummermuth et al. | |
| 6,504,385 B2 | 1/2003 | Hartwell | |
| 6,516,651 B1 | 2/2003 | Geen | |
| 6,553,835 B1 | 4/2003 | Hobbs et al. | |
| 6,629,448 B1 | 10/2003 | Cvancara | |
| 6,654,424 B1 | 11/2003 | Thomae et al. | |
| 6,664,941 B2 | 12/2003 | Itakura et al. | |
| 6,722,206 B2 | 4/2004 | Takada | |
| 6,725,719 B2 | 4/2004 | Cardarelli | |
| 6,737,742 B2 | 5/2004 | Sweterlitsch | |
| 6,781,231 B2 | 8/2004 | Minervini et al. | |
| 6,848,304 B2 | 2/2005 | Geen | |
| 7,051,590 B1 | 5/2006 | Lemkin et al. | |
| 7,054,778 B2 | 5/2006 | Geiger et al. | |
| 7,093,487 B2 | 8/2006 | Mochida | |
| 7,166,910 B2 | 1/2007 | Minervini et al. | |
| 7,173,402 B2 | 2/2007 | Chen et al. | |
| 7,202,552 B2 | 4/2007 | Zhe et al. | |
| 7,210,351 B2 | 5/2007 | Lo et al. | |
| 7,216,525 B2 | 5/2007 | Schroeder | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie et al. | |
| 7,266,349 B2 | 9/2007 | Kappes | |
| 7,293,460 B2 | 11/2007 | Zarabadi et al. | |
| 7,301,212 B1 | 11/2007 | Mian et al. | |
| 7,305,880 B2 | 12/2007 | Caminada et al. | |
| 7,339,384 B2 | 3/2008 | Peng et al. | |
| 7,358,151 B2 | 4/2008 | Araki et al. | |
| 7,436,054 B2 | 10/2008 | Zhe | |
| 7,444,869 B2 | 11/2008 | Johnson et al. | |
| 7,449,355 B2 | 11/2008 | Lutz et al. | |
| 7,451,647 B2 | 11/2008 | Matsuhisa et al. | |
| 7,454,967 B2 | 11/2008 | Skurnik | |
| 7,481,110 B2 | 1/2009 | Handrich et al. | |
| 7,518,493 B2 | 4/2009 | Bryzek et al. | |
| 7,539,003 B2 | 5/2009 | Ray | |
| 7,544,531 B1 | 6/2009 | Grosjean | |
| 7,565,839 B2 | 7/2009 | Stewart et al. | |
| 7,595,648 B2 | 9/2009 | Ungaretti et al. | |
| 7,600,428 B2 | 10/2009 | Robert et al. | |
| 7,616,078 B2 | 11/2009 | Prandi et al. | |
| 7,622,782 B2 | 11/2009 | Chu et al. | |
| 7,694,563 B2 | 4/2010 | Durante et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,817,331 B2 | 10/2010 | Moidu | |
| 7,851,925 B2 | 12/2010 | Theuss et al. | |
| 7,859,352 B2 | 12/2010 | Sutton | |
| 7,950,281 B2 | 5/2011 | Hammerschmidt | |
| 7,965,067 B2 | 6/2011 | Grönthal et al. | |
| 8,004,354 B1 | 8/2011 | Pu et al. | |
| 8,006,557 B2 | 8/2011 | Yin et al. | |
| 8,026,771 B2 | 9/2011 | Kanai et al. | |
| 8,037,755 B2 | 10/2011 | Nagata et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,256,290 B2 | 9/2012 | Mao | |
| 8,375,789 B2 | 2/2013 | Prandi et al. | |
| 8,378,756 B2 | 2/2013 | Huang et al. | |
| 8,421,168 B2 | 4/2013 | Allen et al. | |
| 8,476,970 B2 | 7/2013 | Mokhtar et al. | |
| 8,497,746 B2 | 7/2013 | Visconti et al. | |
| 8,508,290 B2 | 8/2013 | Elsayed et al. | |
| 8,643,382 B2 | 2/2014 | Steele et al. | |
| 8,661,898 B2 | 3/2014 | Watson | |
| 8,710,599 B2 | 4/2014 | Marx et al. | |
| 8,739,626 B2 | 6/2014 | Acar | |
| 8,742,964 B2 | 6/2014 | Kleks et al. | |
| 8,754,694 B2 | 6/2014 | Opris et al. | |
| 8,763,459 B2 | 7/2014 | Brand et al. | |
| 8,813,564 B2 | 8/2014 | Acar | |
| 8,978,475 B2 | 3/2015 | Acar | |
| 9,003,882 B1 | 4/2015 | Ayazi et al. | |
| 9,006,846 B2 | 4/2015 | Bryzek et al. | |
| 9,052,335 B2 | 6/2015 | Coronato et al. | |
| 9,062,972 B2 | 6/2015 | Acar et al. | |
| 9,069,006 B2 | 6/2015 | Opris et al. | |
| 9,094,027 B2 | 7/2015 | Tao et al. | |
| 9,095,072 B2 | 7/2015 | Bryzek et al. | |
| 9,156,673 B2 | 10/2015 | Bryzek et al. | |
| 9,246,018 B2 | 1/2016 | Acar | |
| 9,278,845 B2 | 3/2016 | Acar | |
| 9,278,846 B2 | 3/2016 | Acar | |
| 9,352,961 B2 | 5/2016 | Acar et al. | |
| 9,425,328 B2 | 8/2016 | Marx et al. | |
| 9,444,404 B2 | 9/2016 | Opris et al. | |
| 9,455,354 B2 | 9/2016 | Acar | |
| 9,488,693 B2 | 11/2016 | Kleks et al. | |
| 2002/0021059 A1 | 2/2002 | Knowles et al. | |
| 2002/0083757 A1 | 7/2002 | Geen | |
| 2002/0117728 A1 | 8/2002 | Brosnihhan et al. | |
| 2002/0178831 A1 | 12/2002 | Takada | |
| 2002/0189352 A1 | 12/2002 | Reeds, III et al. | |
| 2002/0196445 A1 | 12/2002 | Mcclary et al. | |
| 2003/0033850 A1 | 2/2003 | Challoner et al. | |
| 2003/0038415 A1 | 2/2003 | Anderson et al. | |
| 2003/0061878 A1 | 4/2003 | Pinson | |
| 2003/0196475 A1 | 10/2003 | Wyse | |
| 2003/0200807 A1 | 10/2003 | Hulsing, II | |
| 2003/0222337 A1 | 12/2003 | Stewart | |
| 2004/0051508 A1 | 3/2004 | Hamon et al. | |
| 2004/0085096 A1 | 5/2004 | Ward et al. | |
| 2004/0085784 A1 | 5/2004 | Salama et al. | |
| 2004/0088127 A1 | 5/2004 | M'closkey et al. | |
| 2004/0119137 A1 | 6/2004 | Leonardi et al. | |
| 2004/0177689 A1 | 9/2004 | Cho | |
| 2004/0211258 A1 | 10/2004 | Geen | |
| 2004/0219340 A1 | 11/2004 | McNeil et al. | |
| 2004/0231420 A1 | 11/2004 | Xie et al. | |

(56) References Cited

U.S. PATENT DOCUMENTS

| | | |
|---|---|---|
| 2004/0251793 A1 | 12/2004 | Matushisa |
| 2005/0005698 A1 | 1/2005 | McNeil et al. |
| 2005/0097957 A1 | 5/2005 | McNeil et al. |
| 2005/0139005 A1 | 6/2005 | Geen |
| 2005/0189635 A1 | 9/2005 | Humpston et al. |
| 2005/0274181 A1 | 12/2005 | Kutsuna et al. |
| 2006/0032308 A1 | 2/2006 | Acar et al. |
| 2006/0034472 A1 | 2/2006 | Bazarjani et al. |
| 2006/0043608 A1 | 3/2006 | Bernier et al. |
| 2006/0097331 A1 | 5/2006 | Hattori |
| 2006/0112764 A1 | 6/2006 | Higuchi |
| 2006/0137457 A1 | 6/2006 | Zdeblick |
| 2006/0141786 A1 | 6/2006 | Boezen et al. |
| 2006/0207328 A1 | 9/2006 | Zarabadi et al. |
| 2006/0213265 A1 | 9/2006 | Weber et al. |
| 2006/0213266 A1 | 9/2006 | French et al. |
| 2006/0213268 A1 | 9/2006 | Asami et al. |
| 2006/0246631 A1 | 11/2006 | Lutz et al. |
| 2006/0283245 A1 | 12/2006 | Konno et al. |
| 2007/0013052 A1 | 1/2007 | Zhe et al. |
| 2007/0034005 A1 | 2/2007 | Acar et al. |
| 2007/0040231 A1 | 2/2007 | Harney et al. |
| 2007/0042606 A1 | 2/2007 | Wang et al. |
| 2007/0047744 A1 | 3/2007 | Harney et al. |
| 2007/0071268 A1 | 3/2007 | Harney et al. |
| 2007/0085544 A1 | 4/2007 | Viswanathan |
| 2007/0099327 A1 | 5/2007 | Hartzell et al. |
| 2007/0113653 A1 | 5/2007 | Nasiri et al. |
| 2007/0114643 A1 | 5/2007 | DCamp et al. |
| 2007/0165888 A1 | 7/2007 | Weigold |
| 2007/0180908 A1 | 8/2007 | Seeger et al. |
| 2007/0205492 A1 | 9/2007 | Wang |
| 2007/0214883 A1 | 9/2007 | Durante et al. |
| 2007/0214891 A1 | 9/2007 | Robert et al. |
| 2007/0220973 A1 | 9/2007 | Acar |
| 2007/0222021 A1 | 9/2007 | Yao |
| 2007/0240486 A1 | 10/2007 | Moore et al. |
| 2007/0284682 A1 | 12/2007 | Laming et al. |
| 2008/0022762 A1 | 1/2008 | Skurnik |
| 2008/0049230 A1 | 2/2008 | Chin et al. |
| 2008/0053236 A1* | 3/2008 | Gogoi ............... B81C 1/00158 73/718 |
| 2008/0079120 A1 | 4/2008 | Foster et al. |
| 2008/0079444 A1 | 4/2008 | Denison |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1 | 4/2008 | Acar |
| 2008/0122439 A1 | 5/2008 | Burdick et al. |
| 2008/0157238 A1 | 7/2008 | Hsiao |
| 2008/0157301 A1 | 7/2008 | Ramakrishna et al. |
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |
| 2008/0253057 A1 | 10/2008 | Rijks et al. |
| 2008/0284365 A1 | 11/2008 | Sri-Jayantha, Sr. et al. |
| 2008/0290756 A1 | 11/2008 | Huang |
| 2008/0302559 A1* | 12/2008 | Leedy ............................ 174/254 |
| 2008/0314147 A1 | 12/2008 | Nasiri |
| 2009/0007661 A1 | 1/2009 | Nasiri et al. |
| 2009/0056443 A1 | 3/2009 | Netzer |
| 2009/0064780 A1 | 3/2009 | Coronato et al. |
| 2009/0064781 A1 | 3/2009 | Ayazi et al. |
| 2009/0072663 A1 | 3/2009 | Ayazi et al. |
| 2009/0085191 A1 | 4/2009 | Najafi et al. |
| 2009/0114016 A1 | 5/2009 | Nasiri et al. |
| 2009/0140606 A1 | 6/2009 | Huang |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0217757 A1 | 9/2009 | Nozawa |
| 2009/0263937 A1 | 10/2009 | Ramakrishna et al. |
| 2009/0266163 A1 | 10/2009 | Ohuchi et al. |
| 2009/0272189 A1 | 11/2009 | Acar et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee et al. |
| 2010/0058864 A1 | 3/2010 | Hsu et al. |
| 2010/0072626 A1 | 3/2010 | Theuss et al. |
| 2010/0077858 A1 | 4/2010 | Kawakubo et al. |
| 2010/0089154 A1 | 4/2010 | Ballas et al. |
| 2010/0122579 A1 | 5/2010 | Hsu et al. |
| 2010/0126269 A1 | 5/2010 | Coronato et al. |
| 2010/0132461 A1 | 6/2010 | Hauer et al. |
| 2010/0155863 A1 | 6/2010 | Weekamp |
| 2010/0194615 A1 | 8/2010 | Lu |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0231452 A1 | 9/2010 | Babakhani et al. |
| 2010/0236327 A1 | 9/2010 | Mao et al. |
| 2010/0263445 A1 | 10/2010 | Hayner et al. |
| 2010/0294039 A1 | 11/2010 | Geen |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0074389 A1 | 3/2011 | Knierim et al. |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1 | 6/2011 | Tanaka et al. |
| 2011/0179868 A1 | 7/2011 | Kaino et al. |
| 2011/0192226 A1 | 8/2011 | Hayner et al. |
| 2011/0201197 A1 | 8/2011 | Nilsson et al. |
| 2011/0234312 A1 | 9/2011 | Lachhwani et al. |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0126349 A1 | 5/2012 | Horning et al. |
| 2012/0162947 A1 | 6/2012 | O'donnell et al. |
| 2012/0191398 A1 | 7/2012 | Murakami et al. |
| 2012/0326248 A1 | 12/2012 | Daneman et al. |
| 2013/0051586 A1 | 2/2013 | Stephanou et al. |
| 2013/0098153 A1 | 4/2013 | Trusov et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |
| 2013/0199263 A1 | 8/2013 | Egretzberger et al. |
| 2013/0199294 A1 | 8/2013 | Townsend et al. |
| 2013/0221457 A1* | 8/2013 | Conti ................... B81B 7/0061 257/416 |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0270660 A1 | 10/2013 | Bryzek et al. |
| 2013/0271228 A1 | 10/2013 | Tao et al. |
| 2013/0277773 A1 | 10/2013 | Bryzek et al. |
| 2013/0283911 A1 | 10/2013 | Ayazi et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx et al. |
| 2014/0190258 A1 | 7/2014 | Donadel et al. |
| 2014/0275857 A1 | 9/2014 | Toth et al. |
| 2014/0306773 A1 | 10/2014 | Kim |
| 2015/0059473 A1 | 3/2015 | Jia |
| 2015/0114112 A1 | 4/2015 | Valzasina et al. |

(56) References Cited

U.S. PATENT DOCUMENTS

| | | |
|---|---|---|
| 2015/0185012 A1 | 7/2015 | Acar |
| 2016/0003618 A1 | 1/2016 | Boser et al. |
| 2016/0264404 A1 | 9/2016 | Acar |
| 2016/0332868 A1 | 11/2016 | Marx |

FOREIGN PATENT DOCUMENTS

| | | |
|---|---|---|
| CN | 1206110 A | 1/1999 |
| CN | 1221210 A | 6/1999 |
| CN | 1272622 A | 11/2000 |
| CN | 102156201 A | 8/2001 |
| CN | 1389704 A | 1/2003 |
| CN | 1532524 A | 9/2004 |
| CN | 1595062 A | 3/2005 |
| CN | 1595063 A | 3/2005 |
| CN | 1603842 A | 4/2005 |
| CN | 1617334 A | 5/2005 |
| CN | 1659810 A | 8/2005 |
| CN | 1693181 A | 11/2005 |
| CN | 1780732 A | 5/2006 |
| CN | 1813192 A | 8/2006 |
| CN | 1816747 A | 8/2006 |
| CN | 1818552 A | 8/2006 |
| CN | 1886669 A | 12/2006 |
| CN | 1905167 A | 1/2007 |
| CN | 1948906 A | 4/2007 |
| CN | 101038299 A | 9/2007 |
| CN | 101044684 A | 9/2007 |
| CN | 101059530 A | 10/2007 |
| CN | 101067555 A | 11/2007 |
| CN | 101069099 A | 11/2007 |
| CN | 101078736 A | 11/2007 |
| CN | 101171665 A | 4/2008 |
| CN | 101180516 A | 5/2008 |
| CN | 101198874 A | 6/2008 |
| CN | 101213461 A | 7/2008 |
| CN | 101217263 A | 7/2008 |
| CN | 101239697 A | 8/2008 |
| CN | 101257000 A | 9/2008 |
| CN | 101270988 A | 9/2008 |
| CN | 101316462 A | 12/2008 |
| CN | 101329446 A | 12/2008 |
| CN | 101426718 A | 5/2009 |
| CN | 101459866 A | 6/2009 |
| CN | 101519183 A | 9/2009 |
| CN | 101520327 A | 9/2009 |
| CN | 101561275 A | 10/2009 |
| CN | 101634662 A | 1/2010 |
| CN | 101638211 A | 2/2010 |
| CN | 101639487 A | 2/2010 |
| CN | 101666813 A | 3/2010 |
| CN | 101738496 A | 6/2010 |
| CN | 101813480 A | 8/2010 |
| CN | 101839718 A | 9/2010 |
| CN | 101055180 A | 10/2010 |
| CN | 101855516 A | 10/2010 |
| CN | 101858928 A | 10/2010 |
| CN | 101916754 A | 12/2010 |
| CN | 101922934 A | 12/2010 |
| CN | 201688848 U | 12/2010 |
| CN | 102109345 A | 6/2011 |
| CN | 102332894 A | 1/2012 |
| CN | 102337541 A | 2/2012 |
| CN | 102364671 A | 2/2012 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 203261317 U | 10/2013 |
| CN | 103403495 A | 11/2013 |
| CN | 203275441 U | 11/2013 |
| CN | 203275442 U | 11/2013 |
| CN | 203301454 U | 11/2013 |
| CN | 203349832 U | 12/2013 |
| CN | 203349834 U | 12/2013 |
| CN | 103663344 A | 3/2014 |
| CN | 203683082 U | 7/2014 |
| CN | 203719664 U | 7/2014 |
| CN | 104094084 A | 10/2014 |
| CN | 104105945 A | 10/2014 |
| CN | 104220840 A | 12/2014 |
| CN | 104272062 A | 1/2015 |
| CN | 103221778 B | 3/2016 |
| CN | 104272062 B | 5/2016 |
| DE | 112011103124 T5 | 12/2013 |
| DE | 102013014881 A1 | 3/2014 |
| EP | 0638782 A1 | 2/1995 |
| EP | 1055910 A1 | 11/2000 |
| EP | 1335185 A1 | 8/2003 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2096759 A1 | 9/2009 |
| EP | 2259019 A1 | 12/2010 |
| EP | 2466257 A1 | 6/2012 |
| EP | 2616772 B1 | 6/2016 |
| EP | 2647593 B1 | 8/2016 |
| EP | 2619536 B1 | 11/2016 |
| JP | 0989927 A | 4/1997 |
| JP | 09089927 A | 4/1997 |
| JP | 10239347 A | 9/1998 |
| JP | 1164002 A | 3/1999 |
| JP | 2000046560 A | 2/2000 |
| JP | 2005024310 A | 1/2005 |
| JP | 2005114394 A | 4/2005 |
| JP | 2005294462 A | 10/2005 |
| JP | 3882972 B2 | 2/2007 |
| JP | 2007024864 A | 2/2007 |
| JP | 2008294455 A | 12/2008 |
| JP | 2009075097 A | 4/2009 |
| JP | 2009186213 A | 8/2009 |
| JP | 2009192458 A | 8/2009 |
| JP | 2009260348 A | 11/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |
| KR | 1020130116212 A | 10/2013 |
| KR | 101332701 B1 | 11/2013 |

(56) References Cited

FOREIGN PATENT DOCUMENTS

| | | |
|---|---|---|
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-9311415 A1 | 6/1993 |
| WO | WO-9503534 A1 | 2/1995 |
| WO | WO-0107875 A1 | 2/2001 |
| WO | WO-0175455 A2 | 10/2001 |
| WO | WO-2008014246 A1 | 1/2008 |
| WO | WO-2008059757 A1 | 5/2008 |
| WO | WO-2008087578 A2 | 7/2008 |
| WO | WO-2009038924 A2 | 3/2009 |
| WO | WO-2009050578 A2 | 4/2009 |
| WO | WO-2009156485 A1 | 12/2009 |
| WO | WO-2011016859 A2 | 2/2011 |
| WO | WO-2011016859 A3 | 2/2011 |
| WO | WO-2011107542 A2 | 9/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

U.S. Appl. No. 12/849,742, filed Aug. 3, 2010, Micromachined Inertial Sensor Devices.
U.S. Appl. No. 12/849,787, filed Aug. 3, 2010, Micromachined Devices and Fabricating the Same.
U.S. Appl. No. 13/821,793, filed Mar. 8, 2013, Micromachined Monolithic 6-Axis Inertial Sensor.
U.S. Appl. No. 13/821,609, filed Mar. 8, 2013, Multi-Die MEMS Package.
U.S. Appl. No. 13/821,586, filed Mar. 8, 2013, Packaging to Reduce Stress on Microelectromechanical Systems.
U.S. Appl. No. 13/821,842, filed Mar. 8, 2013, Micromachined Monolithic 3-Axis Gyroscope With Single Drive.
U.S. Appl. No. 13/821,853, filed Mar. 8, 2013, Micromachined 3-Axis Accelerometer With a Single Proof-Mass.
U.S. Appl. No. 13/821,589, filed Mar. 8, 2013, Sealed Packaging for Microelectromechanical Systems.
U.S. Appl. No. 13/813,443, filed Jan. 31, 2013, Flexure Bearing to Reduce Quadrature for Resonating Micromachined Devices.
U.S. Appl. No. 13/821,612, filed Mar. 8, 2013, Through Silcon via With Reduced Shunt Capacitance.
U.S. Appl. No. 13/821,619, filed Mar. 8, 2013, Inertial Sensor Mode Tuning Circuit.
U.S. Appl. No. 13/362,955, filed Jan. 31, 2012, MEMS Multi-Axis Accelerometer Electrode Structure.
U.S. Appl. No. 13/363,537, filed Feb. 1, 2012, MEMS Proof Mass With Split Z-Axis Portions.
U.S. Appl. No. 13/755,841, filed MEMS Multi-Axis Gyroscope With Central Suspension and Gimbal Structure.
U.S. Appl. No. 13/755,953, filed Jan. 31, 2013, MEMS Multi-Axis Gyroscope Z-Axis Electrode Structure.
U.S. Appl. No. 13/742,942, filed Jan. 16, 2013, Noise Reduction Method With Chopping for a Merged MEMS Accelerometer Sensor.
U.S. Appl. No. 13/742,994, filed Jan. 16, 2013, Self Test of MEMS Accelerometer With ASICS Integrated Capacitors.
U.S. Appl. No. 13/746,016, filed Jan. 21, 2013, Accurate Ninety-Degree Phase Shifter.
U.S. Appl. No. 13/857,349, filed Apr. 5, 2013, MEMS Device Front-End Charge Amplifier.
U.S. Appl. No. 13/857,363, filed Apr. 5, 2013, MEMS Device Automatic-Gain Control Loop for Mechanical Amplitude Drive.
U.S. Appl. No. 13/857,377, filed Apr. 5, 2013, MEMS Device Quadrature Shift Cancellation.
U.S. Appl. No. 13/765,068, filed Feb. 12, 2013, Self Test of MEMS Gyroscope With ASICS Integrated Capacitors.
U.S. Appl. No. 13/860,761, filed Apr. 11, 2013, Micro-Electro-Mechanical- System (MEMS) Driver.
U.S. Appl. No. 13/860,780, filed Apr. 11, 2013, MEMS Quadrature Cancellation and Signal Demodulation.
"U.S. Appl. No. 12/849,742, Notice of Allowance dated Nov. 29, 2013", 7 pgs.
"U.S. Appl. No. 12/849,787, Notice of Allowance dated Dec. 11, 2013", 9 pgs.
"U.S. Appl. No. 13/362,955, Response filed Feb. 17, 2014 to Restriction Requirement dated Dec. 17, 2013", 9 pgs.
"U.S. Appl. No. 13/362,955, Restriction Requirement dated Dec. 17, 2013", 6 pgs.
"U.S. Appl. No. 13/363,537, Non Final Office Action dated Feb. 6, 2014", 10 pgs.
"U.S. Appl. No. 13/742,942, Notice of Allowance dated Jan. 28, 2014", 9 pgs.
"U.S. Appl. No. 13/746,016, Notice of Allowance dated Jan. 17, 2014", 10 pgs.
"U.S. Appl. No. 13/755,841, Restriction Requirement dated Feb. 21, 2014", 6 pgs.
"Chinese Application Serial No. 201180053926.1, Office Action dated Jan. 13, 2014", 7 pgs.
"Chinese Application Serial No. 201180054796.3, Office Action dated Jan. 16, 2014", 8 pgs.
"Chinese Application Serial No. 201180055029.4, Office Action dated Jan. 13, 2014", 7 pgs.
"Chinese Application Serial No. 201320172366.8, Office Action dated Oct. 25, 2013", 8 pgs.
"Chinese Application Serial No. 201320172366.8, Response filed Dec. 24, 2013 to Office Action dated Oct. 25, 2013", 11 pgs.
"Chinese Application Serial No. 201320565239.4, Office Action dated Jan. 16, 2014", w/English Translation, 3 pgs.
"European Application Serial No. 10806751.3, Extended European Search Report dated Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action dated Dec. 27, 2013", 8 pgs.
"Korean Application Serial No. 10-2013-7009775, Response filed Oct. 29, 2013 to Office Action dated Sep. 17, 2013", w/English Claims, 23 pgs.
"Korean Application Serial No. 10-2013-7009777, Office Action dated Jan. 27, 2014", 5 pgs.
"Korean Application Serial No. 10-2013-7009777, Response filed Nov. 5, 2013 to Office Action dated Sep. 17, 2013", 11 pgs.
"Korean Application Serial No. 10-2013-7009788, Office Action dated Dec. 27, 2013", w/English Translation, 10 pgs.
"Korean Application Serial No. 10-2013-7009788, Response filed Oct. 29, 2013 to Office Action dated Aug. 29, 2013", w/English Claims, 22 pgs.
"U.S. Appl. No. 12/849,742, Non Final Office Action dated Mar. 28, 2013", 9 pgs.
"U.S. Appl. No. 12/849,742, Non Final Office Action dated Aug. 23, 2012", 9 pgs.
"U.S. Appl. No. 12/849,742, Response filed Jan. 23, 2012 to Non Final Office Action dated Aug. 23, 2012", 10 pgs.
"U.S. Appl. No. 12/849,787, Non Final Office Action dated May 28, 2013", 18 pgs.
"U.S. Appl. No. 12/849,787, Response filed Feb. 4, 2013 to Restriction Requirement dated Oct. 4, 2012", 7 pgs.

(56) References Cited

OTHER PUBLICATIONS

"U.S. Appl. No. 12/849,787, Restriction Requirement dated Oct. 4, 2012", 5 pgs.
"U.S. Appl. No. 12/947,543, Notice of Allowance dated Dec. 17, 2012", 11 pgs.
"U.S. Appl. No. 13/813,443, Preliminary Amendment dated Jan. 31, 2013", 3 pgs.
"U.S. Appl. No. 13/821,586, Preliminary Amendment dated Mar. 8, 2013", 6 pgs.
"U.S. Appl. No. 13/821,589, Preliminary Amendment dated Mar. 8, 2013", 6 pgs.
"U.S. Appl. No. 13/821,609, Preliminary Amendment dated Mar. 8, 2013", 3 pgs.
"U.S. Appl. No. 13/821,612, Preliminary Amendment dated Mar. 8, 2013", 3 pgs.
"U.S. Appl. No. 13/821,619, Preliminary Amendment dated Mar. 8, 2013", 3 pgs.
"U.S. Appl. No. 13/821,793, Preliminary Amendment dated Mar. 8, 2013", 3 pgs.
"U.S. Appl. No. 13/821,842, Preliminary Amendment dated Mar. 8, 2013", 3 pgs.
"U.S. Appl. No. 13/821,853, Preliminary Amendment dated Mar. 8, 2013", 3 pgs.
"Application Serial No. PCT/US2011/051994, International Republished Application dated Jun. 7, 2012", 1 pg.
"Application Serial No. PCT/US2011/052006, International Republished Application dated Jun. 7, 2012", 1 pg.
"Application Serial No. PCT/US2011/052417, International Republished Application dated Jun. 7, 2012", 1 pg.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", 1 pg.
"International Application Serial No. PCT/US2010/002166, International Preliminary Report on Patentability dated Feb. 16, 2016", 6 pgs.
"International Application Serial No. PCT/US2010/002166, International Search Report dated Feb. 27, 2011", 3 pgs.
"International Application Serial No. PCT/US2010/002166, Written Opinion dated Feb. 28, 2011", 4 pgs.
"International Application Serial No. PCT/US2011/051994, International Preliminary Report on Patentability dated Mar. 28, 2013", 8 pgs.
"International Application Serial No. PCT/US2011/051994, International Search Report dated Apr. 16, 2012", 3 pgs.
"International Application Serial No. PCT/US2011/051994, Written Opinion dated Apr. 16, 2012", 6 pgs.
"International Application Serial No. PCT/US2011/052006, International Preliminary Report on Patentability dated Mar. 28, 2013", 7 pgs.
"International Application Serial No. PCT/US2011/052006, Search Report dated Apr. 16, 2012", 3 pgs.
"International Application Serial No. PCT/US2011/052006, Written Opinion dated Apr. 16, 2012", 5 pgs.
"International Application Serial No. PCT/US2011/052059, International Preliminary Report on Patentability dated Jan. 22, 2013", 14 pgs.
"International Application Serial No. PCT/US2011/052059, Search Report dated Apr. 20, 2012", 4 pgs.
"International Application U.S. Appl. No. PCT/US2011/052059, Written Opinion dated Apr. 20, 2012", 7 pgs.
"International Application Serial No. PCT/US2011/052060, International Preliminary Report on Patentability dated Jan. 22, 2013", 12 pgs.
"International Application Serial No. PCT/US2011/052060, International Search Report dated Apr. 20, 2012", 3 pgs.
"International Application Serial No. PCT/US2011/052060, Written Opinion dated Apr. 20, 2012", 7 pgs.
"International Application Serial No. PCT/US2011/052061, International Preliminary Report on Patentability dated Mar. 28, 2013", 6 pgs.
"International Application Serial No. PCT/US2011/052061, International Search Report dated Apr. 10, 2012", 3 pgs.
"International Application Serial No. PCT/US2011/052061, Written Opinion dated Apr. 10, 2012", 4 pgs.
"International Application Serial No. PCT/US2011/052064, International Preliminary Report on Patentability dated Mar. 28, 2013", 5 pgs.
"International Application Serial No. PCT/US2011/052064, Search Report dated Feb. 29, 2012", 3 pgs.
"International Application Serial No. PCT/US2011/052064, Written Opinion dated Feb. 29, 2012", 3 pgs.
"International Application Serial No. PCT/US2011/052065, International Preliminary Report on Patentability dated Mar. 28, 2013", 7 pgs.
"International Application Serial No. PCT/US2011/052065, International Search Report dated Apr. 10, 2012", 3 pgs.
"International Application Serial No. PCT/US2011/052065, Written Opinion dated Apr. 10, 2012", 5 pgs.
"International Application Serial No. PCT/US2011/052340, International Preliminary Report on Patentability dated Apr. 4, 2013", 5 pgs.
"International Application Serial No. PCT/US2011/052340, Search Report dated Feb. 29, 2012", 3 pgs.
"International Application Serial No. PCT/US2011/052340, Written Opinion dated Feb. 29, 2012", 3 pgs.
"International Application Serial No. PCT/US2011/052369, International Preliminary Report on Patentability dated Apr. 4, 2013", 5 pgs.
"International Application Serial No. PCT/US2011/052369, International Search Report dated Apr. 24, 2012", 6 pgs.
"International Application Serial No. PCT/US2011/052369, Written Opinion dated Apr. 24, 2012", 3 pgs.
"International Application Serial No. PCT/US2011/052417, International Preliminary Report on Patentability dated Apr. 24, 2013", 6 pgs.
"International Application Serial No. PCT/US2011/052417, International Search Report dated Apr. 23, 2012", 5 pgs.
"International Application Serial No. PCT/US2011/052417, Written Opinion dated Apr. 23, 2012", 4 pgs.
"International Application Serial No. PCT/US2013/021411, International Search Report dated Apr. 30, 2013", 5 pgs.
"International Application Serial No. PCT/US2013/021411, Written Opinion dated Apr. 30, 2013", 5 pgs.
"International Application Serial No. PCT/US2013/023877, International Search Report dated May 14, 2013", 3 pgs.
"International Application Serial No. PCT/US2013/023877, Written Opinion dated May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.

(56) References Cited

OTHER PUBLICATIONS

Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package—Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Krishnamurthy, Rajesh, et al., "Drilling and Filling, but not in your Dentist's Chair a look at some recent history of multi-chip and through silicon via (TSV) technology", Chip Design Magazine, (Oct./Nov. 2008), 7 pgs.
Rimskog, Magnus, "Through Wafer via Technology for MEMS and 3D Integration", 32nd IEEE/CPMT International Electronic Manufacturing Technology Symposium, 2007. IEMT '07., (2007), 286-289.
"U.S. Appl. No. 12/849,742, Supplemental Notice of Allowability dated Mar. 17, 2014", 3 pgs.
"U.S. Appl. No. 12/849,742, Supplemental Notice of Allowability dated May 5, 2014", 2 pgs.
"U.S. Appl. No. 12/849,787, Supplemental Notice of Allowability dated Mar. 21, 2014", 3 pgs.
"U.S. Appl. No. 13/362,955, Non Final Office Action dated Apr. 15, 2014", 9 pgs.
"U.S. Appl. No. 13/363,537, Response filed Jun. 6, 2014 to Non Final Office Action dated Feb. 6, 2014", 11 pgs.
"U.S. Appl. No. 13/742,942, Supplemental Notice of Allowability dated Apr. 10, 2014", 2 pgs.
"U.S. Appl. No. 13/755,841, Notice of Allowance dated May 7, 2014", 8 pgs.
"U.S. Appl. No. 13/755,841, Preliminary Amendment filed Oct. 10, 2013", 10 pgs.
"U.S. Appl. No. 13/755,841, Response filed Apr. 21, 2014 to Restriction Requirement dated Feb. 21, 2014", 7 pgs.
"U.S. Appl. No. 13/821,589, Restriction Requirement dated Apr. 11, 2014", 10 pgs.
"Chinese Application Serial No. 2010800423190, Office Action dated Mar. 26, 2014", 10 pgs.
"Chinese Application Serial No. 201180053926.1, Response filed Apr. 29, 2014 to Office Action dated Jan. 13, 2014", w/English Claims, 10 pgs.
"Chinese Application Serial No. 201180055029.4, Response filed May 27, 2014 to Office Action dated Jan. 13, 2014", w/English Claims, 29 pgs.
"Chinese Application Serial No. 201180055309.5, Office Action dated Mar. 31, 2014", w/English Claims, 7 pgs.
"Chinese Application Serial No. 201320172366.8, Office Action dated Jan. 30, 2014", w/English Claims, 3 pgs.
"Chinese Application Serial No. 201320172366.8, Response filed Mar. 18, 2014 to Office Action dated Jan. 30, 2014", w/English Claims, 20 pgs.
"Chinese Application Serial No. 201320565239.4, Response filed Mar. 31, 2014 to Office Action dated Jan. 16, 2014", w/English Claims, 38 pgs.
"European Application Serial No. 118260070.2, Office Action dated Mar. 12, 2014", 1 pg.
"European Application Serial No. 11826070.2, Extended European Search Report dated Feb. 21, 2014", 5 pgs.
"European Application Serial No. 11826071.0, Extended European Search Report dated Feb. 20, 2014", 6 pgs.
"European Application Serial No. 11826071.0, Office Action dated Mar. 12, 2014", 1 pg.
"European Application Serial No. 13001692.6, Response filed Apr. 1, 2014 to Extended European Search Report dated Jul. 24, 2013", 19 pgs.
"European Application Serial No. 13001721.3, Response filed Apr. 7, 2014 to Extended European Search Report dated Jul. 18, 2013", 25 pgs.
"Korean Application Serial No. 10-2013-7009777, Response filed Apr. 28, 2014", w/English Claims, 19 pgs.
U.S. Appl. No. 14/293,747, filed Jun. 2, 2014, Micromachined Inertial Sensor Devices.
"U.S. Appl. No. 12/849,742, Response filed Sep. 30, 2013 to Non-Final Office Action dated Mar. 28, 2013", 12 pgs.
"U.S. Appl. No. 12/849,787, Response filed Oct. 28, 2013 to Non Final Office Action dated May 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action dated Jul. 22, 2013", w/English Translation, 2 pgs.
"Chinese Application Serial No. 201320165465.3, Response filed Aug. 7, 2013 to Office Action dated Jul. 22, 2013", w/English Translation, 39 pgs.
"Chinese Application Serial No. 201320171504.0, Office Action dated Jul. 22, 2013", w/English Translation, 3 pgs.
"Chinese Application Serial No. 201320171504.0, Response filed Jul. 25, 2013 to Office Action dated Jul. 22, 2013", w/English Translation, 33 pgs.
"Chinese Application Serial No. 201320171616.6, Office Action dated Jul. 10, 2013", w/English Translation, 2 pgs.
"Chinese Application Serial No. 201320171757.8, Office Action dated Jul. 11, 2013", w/English Translation, 2 pgs.
"Chinese Application Serial No. 201320171757.8, Response filed Jul. 25, 2013 to Office Action dated Jul. 11, 2013", w/English Translation, 21 pgs.
"Chinese Application Serial No. 201320171757.8, Response filed Jul. 26, 2013 to Office Action dated Jul. 10, 2013", w/English Translation, 40 pgs.
"Chinese Application Serial No. 201320172128.7, Office Action dated Jul. 12, 2013", w/English Translation, 3 pgs.
"Chinese Application Serial No. 201320172128.7, Response filed Aug. 7, 2013 to Office Action dated. Jul. 12, 2013", w/English Translation, 39 pgs.
"Chinese Application Serial No. 201320172366.8, Office Action dated Jul. 9, 2013", w/English Translation, 3 pgs.
"Chinese Application Serial No. 201320172366.8, Response filed Sep. 16, 2013 to Office Action dated Jul. 9, 2013", w/English Translation, 24 pgs.
"Chinese Application Serial No. 201320172367.2, Office Action dated Jul. 9, 2013", w/English Translation, 2 pgs.
"Chinese Application Serial No. 201320172367.2, Response filed Sep. 16, 2013 to Office Action dated Jul. 9, 2013", w/English Translation, 24 pgs.
"Chinese Application Serial No. 201320185461.1, Office Action dated Jul. 23, 2013", w/English Translation, 3 pgs.
"Chinese Application Serial No. 201320185461.1, Response filed Sep. 10, 2013 to Office Action dated Jul. 23, 2013", w/English Translation, 25 pgs.
"Chinese Application Serial No. 201320186292.3, Office Action dated Jul. 19, 2013", w/English Translation, 2 pgs.
"Chinese Application Serial No. 201320186292.3, Response filed Sep. 10, 2013 to Office Action dated Jul. 19, 2013", w/English Translation, 23 pgs.
"European Application Serial No. 13001692.6, European Search Report dated Jul. 24, 2013", 5 pgs.
"European Application Serial No. 13001696.7, Extended European Search Report dated Aug. 6, 2013", 4 pgs.
"European Application Serial No. 13001721.3, European Search Report dated Jul. 18, 2013", 9 pgs.
"International Application Serial No. PCT/US2013/024138, International Search Report dated May 13, 2013", 3 pgs.
"International Application Serial No. PCT/US2013/024138, Written Opinion dated May 24, 2013", 4 pgs.
"Korean Application Serial No. 10-2013-7009775, Office Action dated Sep. 17, 2013", w/English Translation, 6 pgs.

(56) References Cited

OTHER PUBLICATIONS

"Korean Application Serial No. 10-2013-7009777, Office Action dated Sep. 17, 2013", w/English Translation, 8 pgs.
"Korean Application Serial No. 10-2013-7009788, Office Action dated Aug. 29, 2013", w/English Translation, 6 pgs.
"Korean Application Serial No. 10-2013-7009790, Office Action dated Jun. 26, 2013", W/English Translation, 7 pgs.
"Korean Application Serial No. 10-2013-7009790, Response filed Aug. 26, 2013 to Office Action dated Jun. 26, 2013", w/English Claims, 11 pgs.
"Korean Application Serial No. 10-2013-7010143, Office Action dated May 28, 2013", w/English Translation, 5 pgs.
"Korean Application Serial No. 10-2013-7010143, Response filed Jul. 24, 2013 to Office Action dated May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. CAS-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?...>, (Jan. 1, 2004), 123 pgs.
U.S. Appl. No. 14/023,869, filed Sep. 11, 2013, Through Silicon via Including Multi-Material Fill.
"U.S. Appl. No. 13/362,955, Final Office Action dated Nov. 19, 2014", 5 pgs.
"U.S. Appl. No. 13/362,955, Notice of Allowance dated Feb. 25, 2015", 8 pgs.
"U.S. Appl. No. 13/362,955, Response filed Jan. 16, 2015 to Final Office Action dated Nov. 19, 2014", 9 pgs.
"U.S. Appl. No. 13/362,955, Response filed Aug. 15, 2014 to Non Final Office Action dated May 15, 2014", 13 pgs.
"U.S. Appl. No. 13/363,537, Corrected Notice of Allowance dated Jan. 28, 2015", 2 pgs.
"U.S. Appl. No. 13/363,537, Examiner Interview Summary dated Sep. 29, 2014", 3 pgs.
"U.S. Appl. No. 13/363,537, Final Office Action dated Jun. 27, 2014", 8 pgs.
"U.S. Appl. No. 13/363,537, Notice of Allowance dated Nov. 7, 2014", 5 pgs.
"U.S. Appl. No. 13/363,537, Response filed Sep. 29, 2014 to Final Office Action dated Jun. 27, 2014", 9 pgs.
"U.S. Appl. No. 13/742,942, Notice of Allowance dated Jan. 28, 2014", 8 pgs.
"U.S. Appl. No. 13/755,841, Supplemental Notice of Allowability dated Jun. 27, 2014", 2 pgs.
"U.S. Appl. No. 13/821,586, Non Final Office Action dated Jan. 15, 2015", 8 pgs.
"U.S. Appl. No. 13/821,586, Response filed Nov. 24, 2014 to Restriction Requirement dated Sep. 22, 2014", 6 pgs.
"U.S. Appl. No. 13/821,586, Restriction Requirement dated Sep. 22, 2014", 4 pgs.
"U.S. Appl. No. 13/821,589, Non Final Office Action dated Jul. 9, 2014", 10 pgs.
"U.S. Appl. No. 13/821,589, Response filed Nov. 10, 2014 to Non Final Office Action dated Jul. 9, 2014", 15 pgs.
"U.S. Appl. No. 13/821,589, Response to Restriction Requirement dated Apr. 11, 2014", 6 pgs.
"U.S. Appl. No. 13/821,609, Response filed Feb. 13, 2015 to Restriction Requirement dated Dec. 15, 2014", 6 pgs.

"U.S. Appl. No. 13/821,609, Restriction Requirement dated Dec. 15, 2014", 7 pgs.
"U.S. Appl. No. 13/821,612, Non Final Office Action dated Jul. 23, 2014", 8 pgs.
"U.S. Appl. No. 13/821,612, Notice of Allowance dated Dec. 10, 2014", 8 pgs.
"U.S. Appl. No. 13/821,612, Response filed Oct. 23, 2014 to Non Final Office Action dated Jul. 23, 2014", 6 pgs.
"U.S. Appl. No. 13/821,853, Non Final Office Action dated Feb. 18, 2015", 15 pgs.
"U.S. Appl. No. 13/821,853, Non Final Office Action dated Jul. 30, 2014", 10 pgs.
"U.S. Appl. No. 13/821,853, Response filed Dec. 1, 2014 to Non Final Office Action dated Jul. 30, 2014", 10 pgs.
"U.S. Appl. No. 13/860,761, Final Office Action dated Jan. 15, 2015", 14 pgs.
"U.S. Appl. No. 13/860,761, Non Final Office Action dated Aug. 19, 2014", 13 pgs.
"U.S. Appl. No. 13/860,761, Response filed Dec. 19, 2014 to Non Final Office Action dated Aug. 19, 2014", 12 pgs.
"Chinese Application Serial No. 2010800423190, Office Action dated Dec. 3, 2014", 3 pgs.
"Chinese Application Serial No. 2010800423190, Response filed Feb. 15, 2015", 3 pgs.
"Chinese Application Serial No. 2010800423190, Response filed Aug. 11, 2014 to Office Action dated Mar. 26, 2014", w/English Claims, 11 pgs.
"Chinese Application Serial No. 201180054796.3, Office Action dated Jan. 30, 2015", with English translation of claims, 5 pgs.
"Chinese Application Serial No. 201180054796.3, Office Action dated Sep. 4, 2014", w/English Claims, 11 pgs.
"Chinese Application Serial No. 201180054796.3, Response filed Jun. 30, 2014 to Office Action dated Jan. 16, 2014", w/English Claims, 3 pgs.
"Chinese Application Serial No. 201180054796.3, Response filed Nov. 19, 2014 to Office Action dated Sep. 4, 2014", with English translation of claims, 7 pgs.
"Chinese Application Serial No. 201180055029.4, Office Action dated Jul. 2, 2014", w/English Translation, 5 pgs.
"Chinese Application Serial No. 201180055029.4, Response filed Nov. 14, 2014 to Office Action dated Jul. 2, 2014", w/English Claims, 23 pgs.
"Chinese Application Serial No. 201180055309.5, Office Action dated Jan. 8, 2015", with English translation of claims, 5 pgs.
"Chinese Application Serial No. 201180055309.5, Response filed Jan. 14, 2015 to Office Action dated Jan. 8, 2015", 8 pgs.
"Chinese Application Serial No. 201180055309.5, Response filed Aug. 13, 2014 to Office Action dated Mar. 31, 2014", w/English Claims, 25 pgs.
"Chinese Application Serial No. 201180055630.3, Office Action dated Dec. 22, 2014", with English translation of claims, 10 pgs.
"Chinese Application Serial No. 201180055792.7, Office Action dated Dec. 22, 2014", with English translation of claims, 10 pgs.
"Chinese Application Serial No. 201180055794.6, Office Action dated Dec. 17, 2014", with English translation of claims, 9 pgs.
"Chinese Application Serial No. 201310118845.6, Office Action dated Sep. 9, 2014", with English translation of claims, 8 pgs.
"Chinese Application Serial No. 201310118845,6, Response filed Jan. 21, 2015", with English translation of claims, 16 pgs.
"Chinese Application Serial No. 201310119472.4, Office Action dated Sep. 9, 2014", w/English Translation, 11 pgs.
"Chinese Application Serial No. 201310119472.4, Response filed Jan. 21, 2015", with English translation of claims, 16 pgs.
"Chinese Application Serial No. 201380007588.7, Notification to Make Rectification dated Aug. 18, 2014", w/English Translation, 2 pgs.
"Chinese Application Serial No. 201380007588.7, Response filed Oct. 24, 2014", with English translation, 3 pgs.
"Chinese Application Serial No. 201380007615.0, Notification to Make Rectification dated Aug. 18, 2014", w/English Translation, 2 pgs.
"Chinese Application Serial No. 201380007615.0, Response filed Oct. 24, 2014", with English translation, 3 pgs.

(56) References Cited

OTHER PUBLICATIONS

"European Application Serial No. 10806751.3, Response filed Jul. 24, 2014 to Office Action dated Jan. 24, 2014", 26 pgs.
"European Application Serial No. 11826043.9, Office Action dated May 6, 2013", 2 pgs.
"European Application Serial No. 11826043.9, Response filed Nov. 4, 2013 to Office Action dated May 6, 2013", 6 pgs.
"European Application Serial No. 11826067.8, Extended European Search Report dated Oct. 6, 2014", 10 pgs.
"European Application Serial No. 11826068.6, Extended European Search Report dated Jul. 16, 2014", 10 pgs.
"European Application Serial No. 11826068.6, Response filed Feb. 9, 2015", 30 pgs.
"European Application Serial No. 11826070.2, Response filed Sep. 19, 2014 to Office Action dated Mar. 12, 2014", 11 pgs.
"European Application Serial No. 11826071.0, Examination Notification Art. 94(3) dated Dec. 11, 2014", 4 pgs.
"European Application Serial No. 11826071.0, Response filed Sep. 19, 2014 to Office Action dated Mar. 12, 2014", 20 pgs.
"European Application Serial No. 11827347.3, Office Action dated May 2, 2013", 6 pgs.
"European Application Serial No. 11827347.3, Response filed Oct. 30, 2013 to Office Action dated May 2, 2013", 9 pgs.
"European Application Serial No. 11827384.6, Extended European Search Report dated Nov. 12, 2014", 6 pgs.
"European Application Serial No. 13001695.9, European Search Report dated Oct. 5, 2014", 6 pgs.
"European Application Serial No. 13001695.9, Extended European Search Report dated Jan. 22, 2015", 8 pgs.
"European Application Serial No. 13001719.7, Extended European Search Report dated Jun. 24, 2014", 10 pgs.
"European Application Serial No. 13001719.7, Response filed Jan. 21, 2015", 29 pgs.
"International Application Serial No. PCT/US2013/021411, International Preliminary Report on Patentability dated Aug. 14, 2014", 7 pgs.
"International Application Serial No. PCT/US2013/023877, International Preliminary Report on Patentability dated Aug. 14, 2014", 7 pgs.
"International Application Serial No. PCT/US2013/024138, International Preliminary Report on Patentability dated Aug. 14, 2014", 6 pgs.
"International Application Serial No. PCT/US2013/024149, International Preliminary Report on Patentability dated Aug. 14, 2014", 6 pgs.
Dunn, C, et al., "Efficient linearisation of sigma-delta modulators using single-bit dither", Electronics Letters 31(12), (Jun. 1995), 941-942.
Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.
Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.
"U.S. Appl. No. 13/742,942, Supplemental Notice of Allowability dated Apr. 10, 2014", 3 pgs.
"U.S. Appl. No. 13/742,994, Non Final Office Action dated May 1, 2015", 20 pgs.
"U.S. Appl. No. 13/742,994, Response filed Jul. 31, 2015 to Non Final Office Action dated May 1, 2015", 12 pgs.
"U.S. Appl. No. 13/755,953, Non Final Office Action dated May 14, 2015", 11 pgs.
"U.S. Appl. No. 13/755,953, Response filed May 4, 2015 to Restrictiion Requirement dated Mar. 3, 2015", 7 pgs.
"U.S. Appl. No. 13/755,953, Response filed Sep. 15, 2015 to Non Final Office Action dated May 14, 2015", 10 pgs.
"U.S. Appl. No. 13/755,953, Restriction Requirement dated Mar. 15, 2015", 6 pgs.
"U.S. Appl. No. 13/765,068, Notice of Allowance dated May 7, 2015", 12 pgs.
"U.S. Appl. No. 13/813,443, Non Final Office Action dated Jun. 10, 2015", 10 pgs.
"U.S. Appl. No. 13/813,443, Response filed May 22, 2015 to Restriction Requirement dated Apr. 29, 2015", 7 pgs.
"U.S. Appl. No. 13/813,443, Response filed Oct. 13, 2015 to Non Final Office Action dated Jun. 10, 2015", 7 pgs.
"U.S. Appl. No. 13/813,443, Restriction Requirement dated Apr. 29, 2015", 6 pgs.
"U.S. Appl. No. 13/821,586, Notice of Allowance dated Jun. 5, 2015", 6 pgs.
"U.S. Appl. No. 13/821,586, Response filed May 15, 2015 to Non Final Office Action dated Jan. 15, 2015", 12 pgs.
"U.S. Appl. No. 13/821,589, Final Office Action dated Mar. 12, 2015", 13 pgs.
"U.S. Appl. No. 13/821,589, Final Office Action dated Jul. 17, 2015", 14 pgs.
"U.S. Appl. No. 13/821,589, response filed May 12, 2015 to final office action dated Mar. 12, 2015", 12 pgs.
"U.S. Appl. No. 13/821,609, Notice of Allowance dated Mar. 23, 2015", 11 pgs.
"U.S. Appl. No. 13/821,619, Ex Parte Quayle Action dated Jul. 16, 2015", 8 pgs.
"U.S. Appl. No. 13/821,619, Non Final Office Action dated Oct. 13, 2015", 11 pgs.
"U.S. Appl. No. 13/821,619, Response filed Sep. 16, 2015 to Ex Parte Quayle Action dated Jul. 16, 2015", 11 pgs.
"U.S. Appl. No. 13/821,793, Non Final Office Action dated Jul. 27, 2015", 14 pgs.
"U.S. Appl. No. 13/821,842, Examiner Interview Summary dated Sep. 15, 2015", 3 pgs.
"U.S. Appl. No. 13/821,842, Non Final Office Action dated Mar. 18, 2015", 20 pgs.
"U.S. Appl. No. 13/821,842, Notice of Allowance Received dated Sep. 15, 2015", 13 pgs.
"U.S. Appl. No. 13/821,842, Response filed Jun. 18, 2015 Non Final Office Action dated Mar. 18, 2015", 11 pgs.
"U.S. Appl. No. 13/821,842, Supplemental Notice of Allowability dated Sep. 28, 2015", 2 pgs.
"U.S. Appl. No. 13/821,853, Final Office Action dated Jun. 18, 2015", 7 pgs.
"U.S. Appl. No. 13/821,853, Response filed May 18, 2015 to Non Final Office Action dated Feb. 18, 2015", 12 pgs.
"U.S. Appl. No. 13/857,349, Non Final Office Action dated Oct. 8, 2015", 10 pgs.
"U.S. Appl. No. 13/860,761, Advisory Action dated Mar. 25, 2015", 3 pgs.
"U.S. Appl. No. 13/860,761, Notice of Allowance dated Apr. 28, 2015", 8 pgs.
"U.S. Appl. No. 13/860,761, Response filed Mar. 16, 2015 to Final Office Action dated Jan. 16, 2015", 12 pgs.
"U.S. Appl. No. 13/860,761, Response filed Apr. 16, 2015 to Advisory Action dated Mar. 25, 2015", 11 pgs.
"U.S. Appl. No. 14/023,869, Non Final Office Action dated Jun. 15, 2015", 15 pgs.
"U.S. Appl. No. 14/658,579, Non Final Office Action dated Jul. 1, 2015", 9 pgs.
"U.S. Appl. No. 14/658,579, Prliminary Amendment filed Mar. 18, 2015", 8 pgs.
"U.S. Appl. No. 14/658,579, Response filed Oct. 1, 2015 to Non Final Office Action dated Jul. 1, 2015", 11 pgs.
"Chinese Application Serial No. 201180044919.5, Office Action dated Jun. 25, 2015", w/ English Translation, 8 pgs.
"Chinese Application Serial No. 201180054796.3, Office Action dated Jun. 4, 2015", w/ English Translation, 7 pgs.

(56) References Cited

OTHER PUBLICATIONS

"Chinese Application Serial No. 201180054796.3, Response filed Apr. 15, 2015 to Office Action dated Jan. 30, 2015", w/ English Claims, 30 pgs.

"Chinese Application Serial No. 201180055630.3, Office Action dated Jul. 10, 2015", w/ English Claims, 8 pgs.

"Chinese Application Serial No. 201180055630.3, Response filed Sep. 25, 2015 to Office Action dated Jul. 10, 2015", 14 pgs.

"Chinese Application Serial No. 201180055630.3, Response filed Apr. 20, 2015 to Office Action dated Dec. 22, 2014", w/ English Claims, 10 pgs.

"Chinese Application Serial No. 201180055792.7, Office Action dated Jul. 21, 2015", w/ English Translation, 5 pgs.

"Chinese Application Serial No. 201180055792.7, Response filed May 5, 2015 to Office Action dated Dec. 22, 2014", w/ English Claims, 15 pgs.

"Chinese Application Serial No. 201180055794.6, Response filed May 4, 2015 to Office Action dated Dec. 17, 2014", w/ English Claims, 15 pgs.

"Chinese Application Serial No. 201180055823.9, Office Action dated Mar. 19, 2015", w/ English Claims, 8 pgs.

"Chinese Application Serial No. 201180055823.9,Response filed Aug. 3, 2015 to Office Action dated Mar. 19, 2015", w/ English Translation, 14 pgs.

"Chinese Application Serial No. 201180055845.5, Office Action dated Mar. 4, 2015", w/ English Claims, 8 pgs.

"Chinese Application Serial No. 201180055845.5, Office Action dated Aug. 5, 2015", w/ English Translation, 5 pgs.

"Chinese Application Serial No. 201180055845.5,Response filed Jul. 13, 2015 to Office Action dated Mar. 4, 2015", w/ English Translation, 17 pgs.

"Chinese Application Serial No. 201310115550.3, Office Action dated May 22, 2015", w/ English Claims, 8 pgs.

"Chinese Application Serial No. 201310119730.9, Office Action dated May 4, 2015", w/ English Claims, 8 pgs.

"Chinese Application Serial No. 201310119730.9, Response filed Sep. 18, 2015 to Office Action dated May 4, 2015", 5 pgs.

"Chinese Application Serial No. 201310119806.8, Office Action dated Jul. 3, 2015", w/ English Claims, 12 pgs.

"Chinese Application Serial No. 201310119986.X, Office Action dated May 12, 2015", w/ English Claims, 14 pgs.

"Chinese Application Serial No. 201310127961.4, Office Action dated May 6, 2015", w/ English Claims, 7 pgs.

"Chinese Application Serial No. 201310127961.4, Response filed Sep. 2, 2015 to Office Action dated May 6, 2015", 19 pgs.

"Chinese Application Serial No. 201310128046.7, Office Action dated Jul. 23, 2015", w/ English Translation, 7 pgs.

"Chinese Application Serial No. 201310415336.X, Office Action dated Jul. 3, 2015", w/ English Claims, 9 pgs.

"Chinese Application Serial No. 201380007588.7, Office Action dated Jun. 10, 2015", w/ English Claims, 7 pgs.

"Chinese Application Serial No. 201380007615.0, Office Action dated May 6, 2015", w/ English Claims, 7 pgs.

"European Application Serial No. 11826067.8, Response filed Apr. 27, 2015 to Extended European Search Report dated Oct. 6, 2014", 32 pgs.

"European Application Serial No. 11826069.4, Extended European Search Report dated Jul. 23, 2015", 8 pgs.

"European Application Serial No. 11826071.0, Response filed Apr. 13, 2015 to Examination Notification Art. 94(3) dated Dec. 11, 2014", 5 pgs.

"European Application Serial No. 11827347.3, Extended European Search Report dated Jul. 31, 2015", 6 pgs.

"European Application Serial No. 11827357.2, Extended European Search Report dated Aug. 26, 2015", 4 pgs.

"European Application Serial No. 13001720.5, Extended European Search Report dated Aug. 20, 2015", 7 pgs.

U.S. Appl. No. 15/005,783, filed Jan. 25, 2016, Micromachined Monolithic 3-Axis Gyroscope With Single Drive.

U.S. Appl. No. 15/218,852, filed Jul. 25, 2016, Through Silicon via Including Multi-Material Fill.

U.S. Appl. No. 14/804,691, filed Jul. 21, 2015, Multi-Die MEMS Package.

U.S. Appl. No. 14/658,579, filed Mar. 16, 2015, MEMS Proof Mass With Split Z-Axis Portions.

"U.S. Appl. No. 13/742,994, Final Office Action dated Nov. 24, 2015", 11 pgs.

"U.S. Appl. No. 13/742,994, Notice of Allowability dated Sep. 1, 2016", 7 pgs.

"U.S. Appl. No. 13/742,994, Notice of Allowance dated Jun. 21, 2016", 8 pgs.

"U.S. Appl. No. 13/742,994, Response filed Jan. 8, 2016 to Final Office Action dated Nov. 24, 2015", 8 pgs.

"U.S. Appl. No. 13/755,953, Notice of Allowance dated Oct. 28, 2015", 5 pgs.

"U.S. Appl. No. 13/813,443, Notice of Allowance dated Feb. 4, 2016", 7 pgs.

"U.S. Appl. No. 13/821,589, Non Final Office Action dated Feb. 8, 2016", 9 pgs.

"U.S. Appl. No. 13/821,589, Non Final Office Action dated Sep. 9, 2016", 7 pgs.

"U.S. Appl. No. 13/821,589, Response filed May 9, 2016 to Non Final Office Action dated Feb. 8, 2016", 7 pgs.

"U.S. Appl. No. 13/821,589, Response filed Oct. 19, 2015 to Final Office Action dated Jul. 17, 2015", 10 pgs.

"U.S. Appl. No. 13/821,589, Response filed Dec. 9, 2016 to Non Final Office Action dated Sep. 9, 2016", 8 pgs.

"U.S. Appl. No. 13/821,793, Notice of Allowance dated Nov. 24, 2015", 5 pgs.

"U.S. Appl. No. 13/821,793, Response filed Oct. 27, 2015 to Non Final Office Action dated Jul. 27, 2015", 12 pgs.

"U.S. Appl. No. 13/821,842, Corrected Notice of Allowance dated Oct. 19, 2015", 2 pgs.

"U.S. Appl. No. 13/821,853, Final Office Action dated Jan. 25, 2016", 6 pgs.

"U.S. Appl. No. 13/821,853, Notice of Allowance dated May 20, 2016", 8 pgs.

"U.S. Appl. No. 13/821,853, Response filed Apr. 25, 2016 to Final Office Action dated Jan. 25, 2016", 7 pgs.

"U.S. Appl. No. 13/821,853, Response filed Oct. 19, 2015 to Final Office Action dated Jun. 18, 2015", 8 pus.

"U.S. Appl. No. 13/857,349, Notice of Allowance dated May 6, 2016", 9 pgs.

"U.S. Appl. No. 13/857,349, Response filed Jan. 8, 2016 to Non Final Office Action dated Oct. 8, 2015", 10 pgs.

"U.S. Appl. No. 13/857,363, Non Final Office Action dated Aug. 5, 2016", 8 pgs.

"U.S. Appl. No. 13/857,363, Notice of Allowance dated Dec. 2, 2016", 8 pgs.

"U.S. Appl. No. 13/857,363, Response filed Nov. 7, 2016 to Non Final Office Action dated Aug. 5, 2016", 12 pgs.

"U.S. Appl. No. 13/857,377, Non Final Office Action dated Apr. 27, 2016".

"U.S. Appl. No. 13/857,377, Non Final Office Action dated Oct. 13, 2016", 23 pgs.

"U.S. Appl. No. 13/857,377, Response filed Jan. 13, 2017 to Non Final Office Action dated Oct. 13, 2016", 11 pgs.

"U.S. Appl. No. 13/857,377, Response filed Jul. 27, 2016 to Non Final Office Action dated Apr. 27, 2016", 14 pgs.

"U.S. Appl. No. 13/860,780, Final Office Action dated Aug. 18, 2016", 25 pgs.

"U.S. Appl. No. 13/860,780, Non Final Office Action dated Apr. 14, 2016", 25 pgs.

"U.S. Appl. No. 13/860,780, Notice of Allowance dated Dec. 12, 2016", 8 pgs.

"U.S. Appl. No. 13/860,780, Response filed Jul. 14, 2016 to Non Final Office Action dated Apr. 14, 2016", 12 pgs.

"U.S. Appl. No. 13/860,780, Response Filed Nov. 18, 2016 to Final Office Action dated Aug. 18, 2016", 7 pgs.

"U.S. Appl. No. 14/023,869 Response Filed Apr. 15, 2016 to Final Office Action dated Dec. 15, 2015", 12 pgs.

(56) References Cited

OTHER PUBLICATIONS

"U.S. Appl. No. 14/023,869, Examiner Interview Summary dated Apr. 19, 2016", 3 pgs.
"U.S. Appl. No. 14/023,869, Final Office Action dated Dec. 15, 2015", 14 pgs.
"U.S. Appl. No. 14/023,869, Notice of Allowance dated May 4, 2016", 8 pgs.
"U.S. Appl. No. 14/023,869, Preliminary Amendment filed Dec. 4, 2013", 3 pgs.
"U.S. Appl. No. 14/023,869, Response filed Nov. 16, 2015 to Non Final Office Action dated Jun. 15, 2015", 12 pgs.
"U.S. Appl. No. 14/658,579, Advisory Action dated Oct. 26, 2016", 3 pgs.
"U.S. Appl. No. 14/658,579, Final Office Action dated Jul. 14, 2016", 6 pgs.
"U.S. Appl. No. 14/658,579, Final Office Action dated Oct. 21, 2015", 10 pgs.
"U.S. Appl. No. 14/658,579, Non Final Office Action dated Mar. 16, 2016", 5 pgs.
"U.S. Appl. No. 14/658,579, Notice of Allowance dated Nov. 2, 2016", 5 pgs.
"U.S. Appl. No. 14/658,579, Response filed Oct. 16, 2016 to Final Office Action dated Jul. 14, 2016", 9 pgs.
"U.S. Appl. No. 14/658,579, Response filed Feb. 22, 2016 to Final Office Action dated Oct. 21, 2015", 11 pgs.
"U.S. Appl. No. 14/658,579, Response filed Jun. 16, 2016 to Non-Final Office Action dated Mar. 16, 2016", 9 pgs.
"U.S. Appl. No. 14/658,579, Response filed Oct. 20, 2016 to Final Office Action dated Jul. 14, 2016", 9 pgs.
"U.S. Appl. No. 15/005,783 Preliminary Amendment Filed May 26, 2016", 9 pgs.
"U.S. Appl. No. 15/218,852, Non Final Office Action dated Dec. 15, 2016", 16 pgs.
"U.S. Appl. No. 15/218,852, Preliminary Amendment filed Jul. 27, 2016", 7 pgs.
"Chinese Application Serial No. 201180044919.5, Office Action dated Apr. 25, 2016", w/ English Translation, 7 pgs.
"Chinese Application Serial No. 201180044919.5, Response filed Jan. 11, 2016 to Office Action dated Jun. 25, 2015", with English machine translation, 22 pgs.
"Chinese Application Serial No. 201180044919.5, Response filed May. 12, 2016 to Office Action dated Apr. 25, 2016", w/ English Translation, 13 pgs.
"Chinese Application Serial No. 201180055630.3, Office Action dated May 16, 2016", (English Translation), 9 pgs.
"Chinese Application Serial No. 201180055630.3, Office Action dated Dec. 7, 2015", W/ English Translation, 5 pgs.
"Chinese Application Serial No. 201180055630.3, Response filed Feb. 19, 2016 to Office Action dated Dec. 15, 2015", w/ English Translation of Claims, 10 pgs.
"Chinese Application Serial No. 201180055630.3, Response filed Sep. 26, 2016 to Office Action dated May 16, 2016", (With English Translation), 15 pgs.
"Chinese Application Serial No. 201180055794.6, Voluntary Amendment filed Jul. 7, 2015", with English translation of claims, 9 pgs.
"Chinese Application Serial No. 201180055823.9, Office Action dated May 10, 2016", w/ English Translation, 8 pgs.
"Chinese Application Serial No. 201180055823.9, Office Action dated Nov. 17, 2015", w/ English Translation, 8 pgs.
"Chinese Application Serial No. 201180055823.9, Response filed Feb. 2, 2016 to Office Action dated Nov. 17, 2015", (English Translation of Claims), 15 pgs.
"Chinese Application Serial No. 201180055823.9, Response filed Jul. 25, 2016 to Office Action dated May 10, 2016", with English translation of claims, 17 pgs.
"Chinese Application Serial No. 201180055845.5, Response filed Nov. 20, 2015 to Office Action dated Aug. 5, 2015", With English Claims, 9 pgs.
"Chinese Application Serial No. 201310115550,3, Response filed Sep. 30, 2015 to Office Action dated May 22, 2015", w/ English Claims, 15 pgs.
"Chinese Application Serial No. 201310119730.9, Office Action dated Jan. 29, 2016", w/ English Translation, 7 pgs.
"Chinese Application Serial No. 201310119730.9, Office Action dated Oct. 10, 2016", W/ English Translation, 8 pgs.
"Chinese Application Serial No. 201310119730.9, Response filed Jun. 13, 2016 to Office Action dated Jan. 29, 2016", with English translation of claims, 19 pgs.
"Chinese Application Serial No. 201310119806.8, Office Action dated May 13, 2016", with English translation of claims, 11 pgs.
"Chinese Application Serial No. 201310119806.8, Response filed Jan. 18, 2016 to Office Action dated Jul. 3, 2015", (English Translation of Claims), 11 pgs.
"Chinese Application Serial No. 201310119806.8, Response filed Sep. 28, 2016 to Office Action dated May 13, 2016", with English translation of claims, 13 pgs.
"Chinese Application Serial No. 201310119986.X, Office Action dated Dec. 18, 2015", w/ English Translation, 6 pgs.
"Chinese Application Serial No. 201310119986.X, Office Action dated Dec. 27, 2016", with English Translation, 7 pgs.
"Chinese Application Serial No. 201310119986.X, Response filed Apr. 29, 2016 to Office Action dated Dec. 18, 2015", (English Translation of Claims), 14 pgs.
"Chinese Application Serial No. 201310119986.X, Response filed Sep. 25, 2015 to Office Action dated May 12, 2015", w/ English Claims, 7 pgs.
"Chinese Application Serial No. 201310120172.8, Office Action dated Aug. 1, 2016", with English translation of claims, 19 pgs.
"Chinese Application Serial No. 201310120172.8, Office Action dated Nov. 3, 2015", w/ English Translation, 11 pgs.
"Chinese Application Serial No. 201310120172.8, Office Action dated Dec. 8, 2016", with English Translation, 11 pgs.
"Chinese Application Serial No. 201310120172.8, Response filed May 18, 2016 to Office Action dated Nov. 3, 2015", with English translation of claims, 21 pgs.
"Chinese Application Serial No. 201310120172.8, Response filed Oct. 16, 2016 to Office Action dated Aug. 1, 2016", with English translation of claims, 20 pgs.
"Chinese Application Serial No. 201310128046.7, Response filed Oct. 14, 2015 to Office Action dated Jul. 23, 2015", w/ English Claims, 23 pgs.
"Chinese Application Serial No. 201310415336.X, Office Action dated Apr. 26, 2016", w/ English Translation, 11 pgs.
"Chinese Application Serial No. 201310415336.X, Response filed Jan. 18, 2016 to Office Action dated Jul. 3, 2015", (English Translation of Claims), 11 pgs.
"Chinese Application Serial No. 201310415336.X, Response filed Sep. 12, 2016 to Office Action dated Apr. 26, 2016", W/ English Translation of Claims. 13 pgs.
"Chinese Application Serial No. 201380007523.2, Office Action dated Oct. 9, 2016", with English translation of claims, 7 pgs.
"Chinese Application Serial No. 201380007523.2, Office Action dated Dec. 31, 2015", w/ English Translation, 12 pgs.
"Chinese Application Serial No. 201380007523.2, Response filed May 31, 2016 to Office Action dated Dec. 31, 2015", with English translation of claims, 16 pgs.
"Chinese Application Serial No. 201380007523.2, Response filed Dec. 20, 2016 to Office Action dated Oct. 9, 2016", with English translation of claims, 32 pgs.
"Chinese Application Serial No. 201380007577.9, Office Action dated Aug. 18, 2016", with English translation of claims, 7 pgs.
"Chinese Application Serial No. 201380007577.9, Office Action dated Dec. 21, 2015", w/ English Translation, 9 pgs.
"Chinese Application Serial No. 201380007577.9, Response filed May 5, 2016 to Office Action dated Dec. 21, 2015", w/ English Claims, 17 pgs.
"Chinese Application Serial No. 201380007577.9, Response filed Nov. 2, 2016 to Office Action dated Aug. 18, 2016", 5 pgs.
"Chinese Application Serial No. 201380007588.7, Response filed Oct. 26, 2015 to Office Action dated Jun. 10, 2015", w/ English Claims, 9 pgs.

(56) References Cited

OTHER PUBLICATIONS

"Chinese Application Serial No. 201380007615.0, Response filed Jan. 5, 2016 to Office Action dated May 6, 2015", w/ English Claims, 13 pgs.

"Chinese Application Serial No. 201380007615.0, Response filed Nov. 23, 2015 to Office Action dated May 6, 2015", With English Claims, 15 pgs.

"Definition of baseband signal downloaded from "Tech Terms"", (Jul. 15, 2016), 1 pg.

"European Application Serial No. 11826043.9, Extended European Search Report dated Feb. 23, 2016", 6 pgs.

"European Application Serial No. 11826069.4, Response filed Feb. 22, 2016 to Extended European Search Report dated Jul. 23, 2015". W/ English Translation, 26 pgs.

"European Application Serial No. 11827357.2, Communication under Rule 71(3) dated Apr. 25, 2016", 36 pgs.

"European Application Serial No. 13001694.2, Communication Pursuant to Article 94(3) EPC dated Nov. 2, 2016", 5 pgs.

"European Application Serial No. 13001694.2, Extended European Search Report dated Oct. 2, 2015", 8 pgs.

"European Application Serial No. 13001694.2, Response filed Apr. 26, 2016 to Office Action dated Oct. 2, 2015", 18 pgs.

"European Application Serial No. 13001694.2, Response filed Dec. 23, 2016 to Office Action dated Nov. 2, 2016", 8 pgs.

"European Application Serial No. 13001695.9, Response filed Aug. 24, 2015 to Extended European Search Report dated Jan. 22, 2015", 9 pgs.

"European Application Serial No. 13001719.7, Communication Pursuant to Article 94(3) EPC dated Jul. 4, 2016", 4 pgs.

"European Application Serial No. 13001719.7, Response filed Nov. 9, 2016 to Communication Pursuant to Article 94(3) EPC dated Jul. 4, 2016", 14 pgs.

"European Application Serial No. 13001917.7, Extended European Search Report dated Apr. 11, 2016", 5 pgs.

"European Application Serial No. 13001917.7, Response filed Nov. 8, 2016 to Office Action dated Apr. 11, 2016", 16 pgs.

"European Application Serial No. 13001918.5, Extended European Search Report dated Dec. 3, 2015", 8 pgs.

"European Application Serial No. 13001918.5, Response filed Jul. 8, 2016 tp Office Action dated Dec. 3, 2015", 36 pgs.

"Explanation of phase shifters from "Microwaves 101"", (Aug. 4, 2016), 5 pgs.

"Korean Application Serial No. 2012-7005729, Office Action dated May 3, 2016", w/ English Claims, 11 pgs.

"Korean Application Serial No. 2012-7005729, Response filed Jun. 29, 2016 to Office Action dated May 3, 2016", (English Translation of Claims), 29 pgs.

\* cited by examiner

MICROELECTROMECHANICAL PRESSURE SENSOR INCLUDING REFERENCE CAPACITOR

CLAIM OF PRIORITY

The present application is a U.S. National Stage Filing under 35 U.S.C. 371 from International Patent Application Serial No. PCT/US2011/052369 filed on Sep. 20, 2011, and published on Mar. 29, 2012 as WO 2012/040211 A2, which claims the benefit of priority to U.S. Provisional Patent Application Ser. No. 61/384,320, entitled "INTEGRATED PRESSURE SENSOR," filed Sep. 20, 2010; which are hereby incorporated by reference herein in its entirety.

The present application is related to U.S. patent application Ser. No. 12/849,742, entitled "MICROMACHINED INERTIAL SENSOR DEVICES," filed Aug. 3, 2010; U.S. patent application Ser. No. 12/849,787, entitled "MICROMACHINED DEVICES AND FABRICATING THE SAME," filed Aug. 3, 2010; U.S. Provisional Patent Application Ser. No. 61/384,319, entitled "TSV WITH REDUCED SHUNT CAPACITANCE," filed Sep. 20, 2010; PCT Patent Application Serial No. PCT/US2011/052060, entitled "SEALED PACKAGING FOR MICROELECTROMECHANICAL SYSTEMS," filed Sep. 18, 2011; and U.S. Provisional Patent Application Ser. No. 61/384,240, entitled "MICROMACHINED MONOLITHIC 6-AXIS INERTIAL SENSOR," filed Sep. 18, 2010, each of which is incorporated by reference in its entirety.

BACKGROUND

Pressure transducers such as microphones, including microelectricalmechanical systems (MEMS) pressure transducers, may be used in electronic devices to perform various functions, such as recording or playing sound. As technology evolves, designers of next-generation electronic devices demand pressure transducers that are smaller, easier to manufacture and use and that are less expensive.

BRIEF DESCRIPTION OF THE DRAWINGS

In the drawings, which are not necessarily drawn to scale, like numerals may describe similar components in different views. Like numerals having different letter suffixes may represent different instances of similar components.

The drawings illustrate generally, by way of example, but not by way of limitation, various embodiments discussed in the present document.

DETAILED DESCRIPTION

This document discusses, among other things, MEMs-based pressure sensors such as microphones. MEMs-based pressure sensors are quickly becoming the technology of choice for cell phones and other portable audio devices. Performance, cost and size are key factors contributing to the ultimate success of any portable/hand held pressure sensor technology. The document discusses the structure of such devices, including how to make and use them.

Figure 1A:
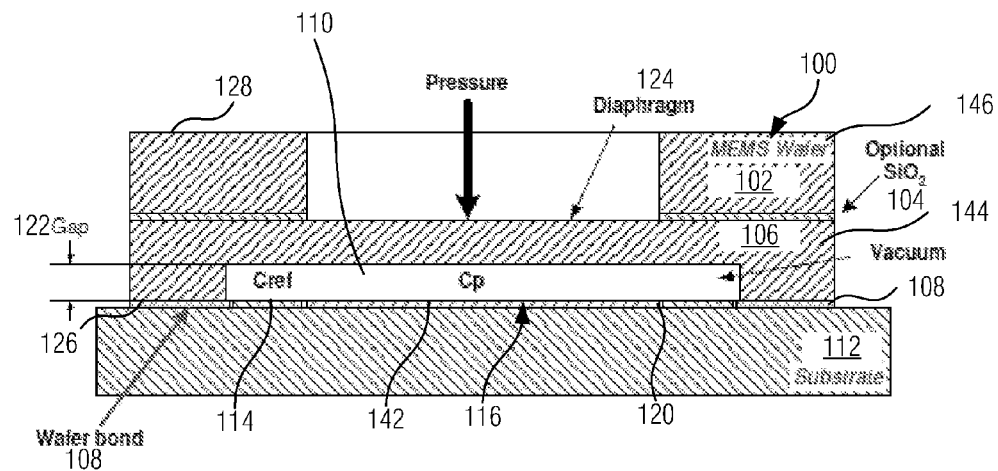
FIG. 1A is a cross section of the sensor of FIG. 1B, take at line 1A-1A.
Figure 1B:
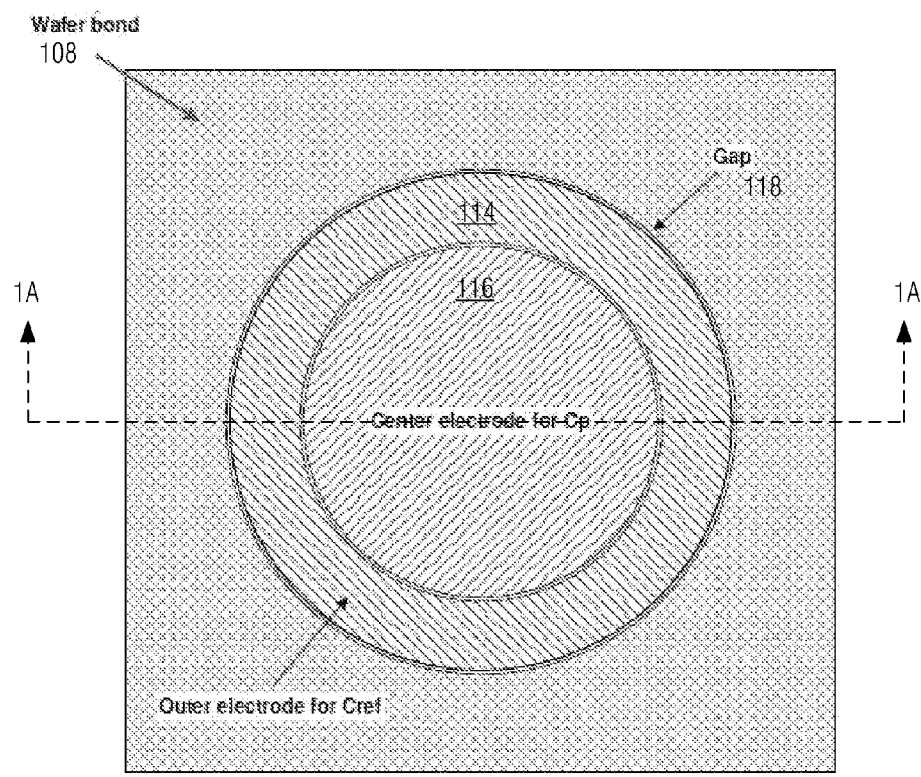
FIG. 1B is a pressure sensor, according to an example.

FIG. 1A is a cross section of the sensor of FIG. 1B, take at line 1A-1A. FIG. 1B is a pressure sensor, according to an example. Examples discussed herein provide an absolute pressure sensor that delivers improved performance in a small die size. An example provides an active electrode of a pressure measuring capacitor $C_p$. An example provides a reference capacitor $C_{ref}$ that changes little or not at all with pressure. An example provides a pressure port opening to capacitor $C_p$ and reference capacitor $C_{ref}$ and few or no electrical connections on a single wafer. In an example, the sensor is compatible with all media.

In an example, a silicon die or wafer or wafer assembly includes a vibratory diaphragm 124, the die having a silicon die top 128 opposite a silicon die bottom 126, with a top silicon die port 124 extending from the silicon die top through the silicon die to a top of the vibratory diaphragm, and with a bottom silicon die port 110 extending from the silicon die bottom to a bottom of the vibratory diaphragm. In an example, the bottom silicon die port 110 has a cross sectional area that is larger than a cross-sectional area of the top silicon die port 124. In an example, a capacitor electrode 116 is disposed along a bottom of the silicon die 126, across the bottom silicon die port 124. In an example, the capacitor electrode 116 includes a first signal generation portion 142. In an example, the first signal generation portion 142 is coextensive with the top silicon die port 124. In an example, the capacitor electrode includes a second signal generation portion 114. In an example, the second signal generation portion surrounds the first portion 142. In an example, the top silicon die port 124 has a circular cross-section. In an example, the bottom silicon die port 110 has a circular cross section.

In an example, the capacitor electrode 116 is a layer that defines a cavity including the bottom silicon die port 110. In an example, cavity is configured to be sealed under vacuum relative to an atmosphere to which the vibratory diaphragm is exposed. In an example, the seal is hermetic.

In an example, the die 100 is formed of a bottom portion 144 including the vibratory diaphragm, and a top portion 146 joined to the bottom portion. In an example, the top portion 146 of the silicon die is joined to the bottom portion 144 of the silicon die at a layer 104 including silicon dioxide.

In an example, differential measurement from the cavity 110 allows cancelations of one or more common mode errors, such as temperature, pressure leak, electronics charge injection, etc., which improves performance. In an example, under applied pressure, the diaphragm deflects changing $C_p$. In an example, the area over $C_{ref}$ is thicker than the diaphragm, and deflects less under an applied pressure. In an example, diaphragm deflection is proportional to the cube of diaphragm thickness, and as such it is easy to achieve little or no deflection for $C_{ref}$. In an example, for barometric pressure measurement, a 13 micrometer thick diaphragm with a 300 micrometer diameter is used in conjunction with a $C_{ref}$ of a diameter of 460 micrometers that conforms to the perimeter of $C_p$. In an example, a 10 micrometer gaps extends between $C_{ref}$ and $C_p$, such as around them, such as encircling them. In an example with these parameters, pressure sensitivity of $C_{ref}$ is approximately 1000 times smaller than $C_p$, providing a well-performing reference electrode. In an example, for the above-referenced dimensions, the $C_p$ electrode has a capacitance of 0.09 mm$^2$. In an example, with 1 micrometer gap 122, $C_p$ would be equal to 0.8 picofarads. In an example, a noise density of high performance low power electronics is about 10 zF/√Hz, which results in resolution of 1 part in 80,000,000 for 1 Hz bandwidth. In an example, this provides 26-bit resolution. In an example, such resolution for barometric pressure range includes a full scale equal to approximately 50% of $C_p$. In an example, the capacitor constructed as such has a resolution of about 0.5 cm (0.2") altitude.

In an example, the capacitor electrode layer 116 is formed of metal, such as AlGe, AuSn, Cu, etc. In an example, the capacitor electrode layer 116 can be used to bond the wafer 100 to a substrate 112 to create a reference vacuum cavity 110. In an example, the bond is hermetic. In an example, the same metal can be used to form one or both $C_p$ 116 and $C_{ref}$ 114 electrodes.

In an example, the metal temperature coefficient of such an electrode is approximately is 10 to 20 ppm/° C. In an example, with temperature changes, the gap 120 disposed between $C_p$ and $C_{ref}$ varies with temperature fluctuation, which can contribute to temperature errors. The present subject matter provides several benefits to address such an error. In an example, a first level of temperature common mode rejection is accomplished by having bond metal and electrode metal of similar thickness. In an example, a second level of temperature common mode rejection is formed by forming the $C_p$ and $C_{ref}$ electrodes of the same material or a continuous material.

In an example, a silicon fusion bond is used to create the bond 108 to bond the capacitor electrode layer, including active electrodes, to other parts of the sensor, $C_p$ and $C_{ref}$. Accordingly, in some examples, $C_p$ and $C_{ref}$ are formed by any one of a number of processes, including, but not limited to, diffusion, ion implant, polysilicon and/or thin film deposition. In an example, for such a formed capacitor electrode, the first level of temperature common mode rejection set forth above is not needed, as a fusion bond provides a single crystal silicon. A second level of common mode rejection is similar to an above described common mode rejection.

In an example, the sensor can be fabricated using one or more of three masks: pressure sensor cavity, gap cavity and electrode pattern.

Figure 2:
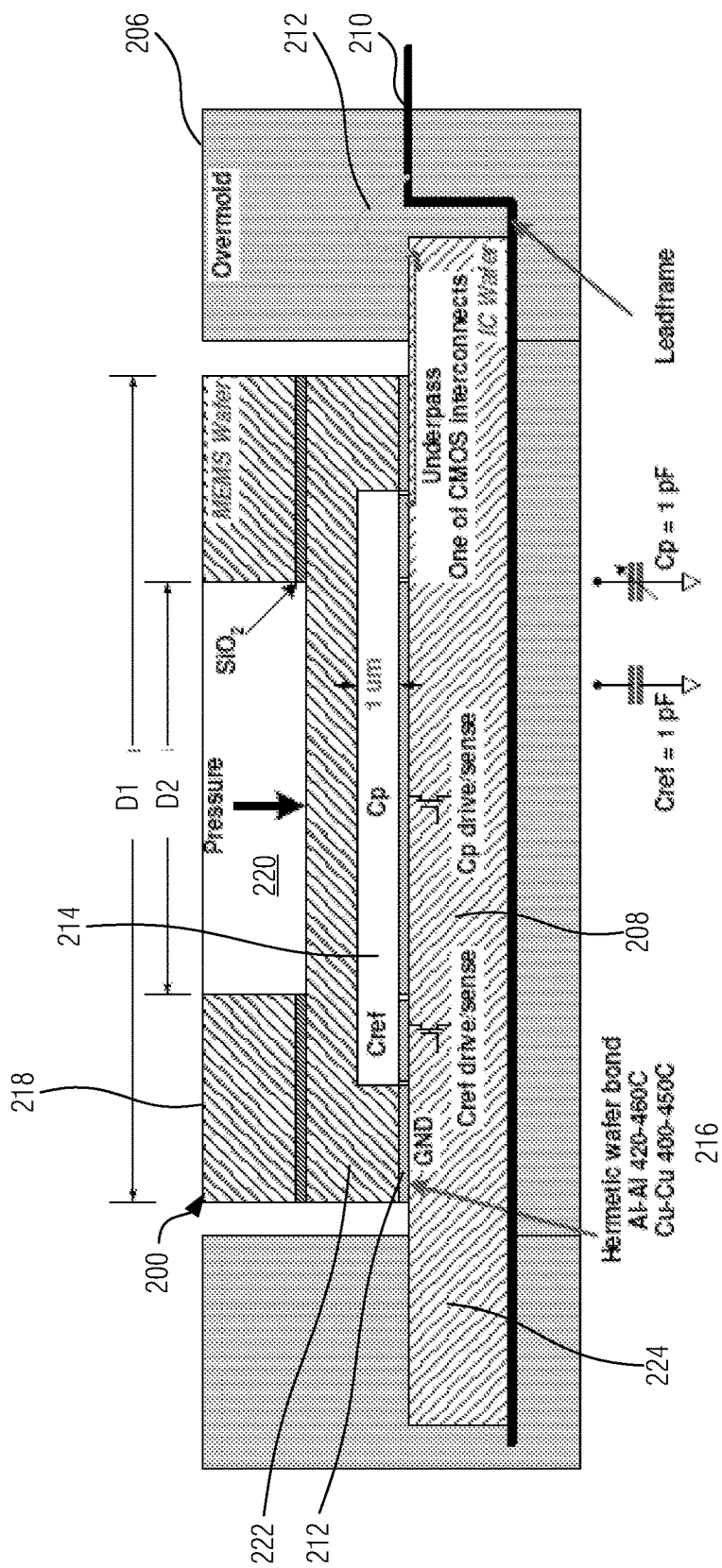
FIG. 2 illustrates an active electrode that is bonded to a wafer to form vertically integrated pressure sensor, according to an example.

FIG. 2 illustrates an active electrode bonded to a wafer to form vertically integrated pressure sensor, according to an example. In an example, the wafer or substrate 112 includes an application specific integrated circuit ("ASIC") 210. In an example the active electrode 212 is bonded to the ASIC wafer. In an example, active electronics are connected directly to metal electrodes. In an example, such a connection can reduce shunt capacitance. In an example, an electrical signal from vacuum cavity is achieved through a diffused underpass.

In an example, a cost effective packaging of the sensor 200 is achieved by overmolding the sensor, such as with plastic overmolding. In an example, an overmolding 206 defines a hole, with the integrated sensor 200 disposed on a leadframe 210. In an example, the substrate such as an ASIC is overmolded in plastic. In an example, the sensor 200 does not touch the overmold 206 such as to avoid induced stress which can affect performance.

In an example, the top portion 218 of the die is circular. In an example, it has a diameter D1 of approximately 600 micrometers. In an example, the top port 220 of the die is circular. In an example, it has a diameter D2 of approximately 600 micrometers. In an example, the ASIC 224 includes electronics, including, but not limited to, drive electronics for $C_p$, drive electronics for $C_{ref}$, sense electronics for $C_p$ and sense electronics for $C_{ref}$.

In an example, a bottom portion 222 of the die is coupled with the ASIC 224. In an example, the bond includes and aluminum to aluminum bond. In an example, the bond is formed at from approximately 420 Celsius to approximately 460 Celsius. In an example, the bond includes and copper to copper bond. In an example, the bond is formed at from approximately 400 Celsius to approximately 450 Celsius. In an example, a bottom portion 222 of the die is grounded to the ASIC 224. In an example, the capacitance of Cref is approximately one picofarad, and the capacitance remains substantially constant in use. In an example, the capacitance of Cp is approximately one picofarad, and the capacitance varies in use.

An example includes a wire bond 212. In an example, the wire bond 212 is coupled to an underpass disposed in the ASIC 224. In an example, the underpass includes one or more complementary metal-oxide-semiconductor ("CMOS") interconnects.

Figure 3:
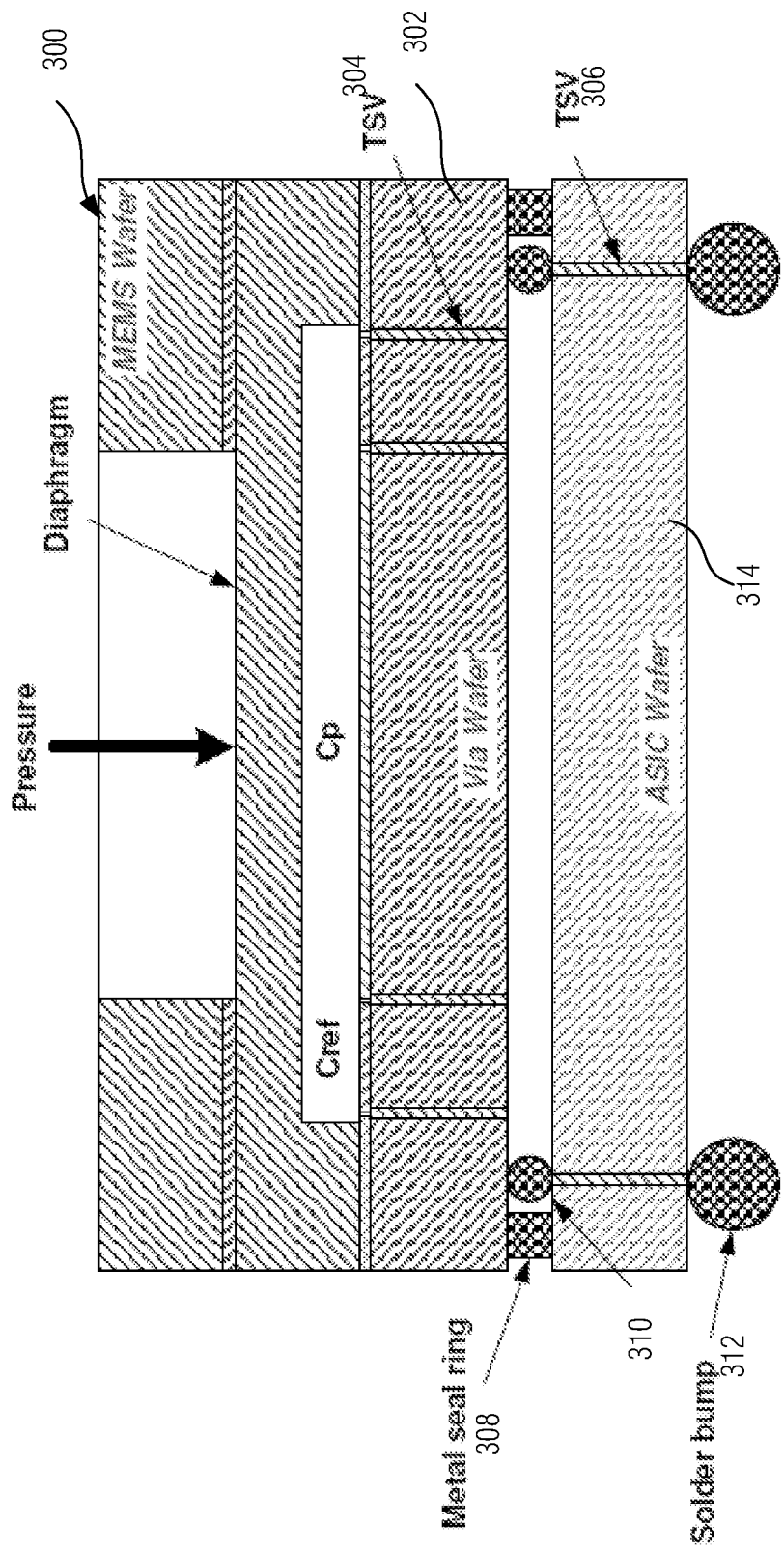
FIG. 3 illustrates a chip scaled packaged pressure sensor that uses through-silicon-via wafer as substrate, and solder bumps to connect the sensor to an integrated circuit wafer and the integrated circuit wafer to a printed circuit board, according to an example.

FIG. 3 illustrates a chip scaled packaged pressure sensor that uses through-silicon-via wafer as substrate, and solder bumps to connect the sensor to an integrated circuit wafer and the integrated circuit wafer to a printed circuit board, according to an example. In an example, the substrate 302 is a low resistivity through-silicon-via ("TSV") wafer. In an example, the TSVs 304 are selected to reduce shunt capacitance, as described in U.S. Provisional Patent Application Ser. No. 61/384,319, entitled "TSV WITH REDUCED SHUNT CAPACITANCE," filed Sep. 20, 2010, which is incorporated by reference in its entirety. In an example, one or both of the capacitor electrodes $C_p$ and $C_{ref}$ are formed by the trench. In an example, solder bumps are used to connect the via wafer 302 to another substrate such as the ASIC wafer 306. In an example, solder bumps 310, 312 are used to coupled the substrate 306 to another substrate such as a PCB.

In an example, the sensor 300 is bonded to ASIC wafer 306 through a seal ring such as a metal seal ring 308. In an example, the seal ring 308 is formed of a metal. In an example, the seal ring 308 provides a moisture seal. A seal ring is formed as set forth in PCT Patent Application Ser. No. PCT/US2011/052060, entitled "SEALED PACKAGING FOR MICROELECTROMECHANICAL SYSTEMS," filed September 18, which is incorporated by reference in its entirety. In an example, an ASIC wafer includes one or more TSV 306 to provide connection across the wafer to another substrate such as a PCB.

Figure 4A:
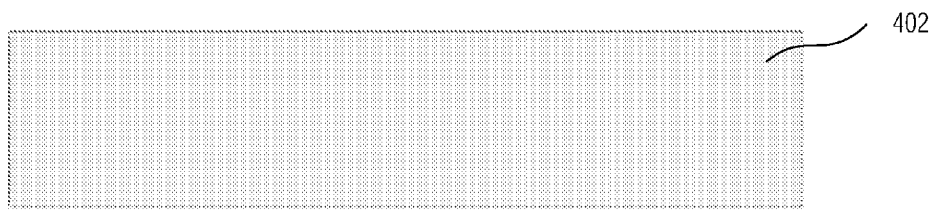
FIG. 4A is a unprocessed die, according to an example, according to an example.
Figure 4B:
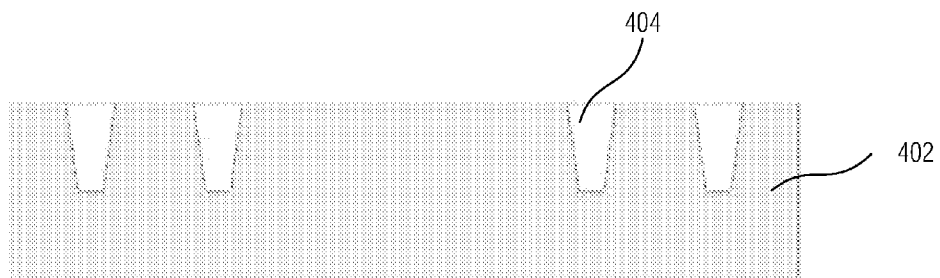
FIG. 4B illustrates the die after etching a wafer to include via openings, according to an example.

FIG. 4A is a unprocessed die, according to an example, according to an example. FIG. 4B illustrates the die after etching a wafer to include via openings, according to an example. In an example, etching the first wafer includes etching a double side polished wafer that is 725 micrometers thick. An example includes etching the first wafer includes pattern and deep reactive-ion etching ("DRIE") etching via openings.

Figure 4C:
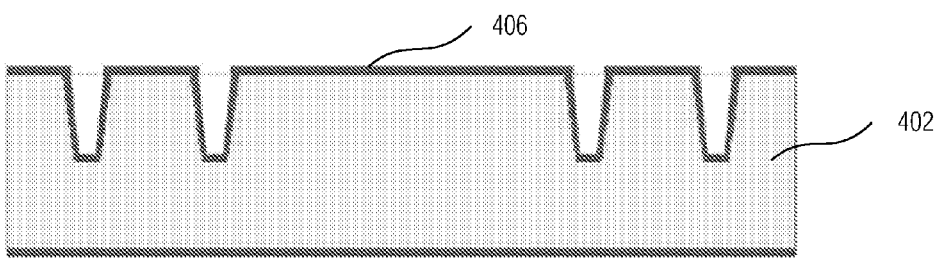
FIG. 4C illustrates the die after growing an oxide on the etched portions of the first wafer, according to an example.

FIG. 4C illustrates the die after growing an oxide 406 on the etched portions of the first wafer 402, according to an example. An example that includes growing a 1 micrometer thermal oxide on the first wafer.

Figure 4D:
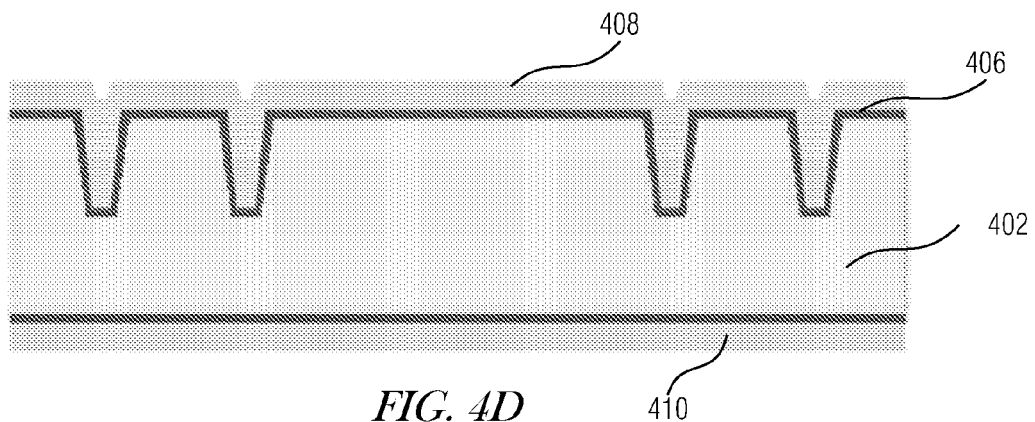
FIG. 4D illustrates the die after depositing a film onto the grown oxide, according to an example.

FIG. 4D illustrates the die after depositing a film onto the grown oxide, according to an example. An example includes depositing a film 408 includes depositing a conformal poly silicon film.

Figure 4E:
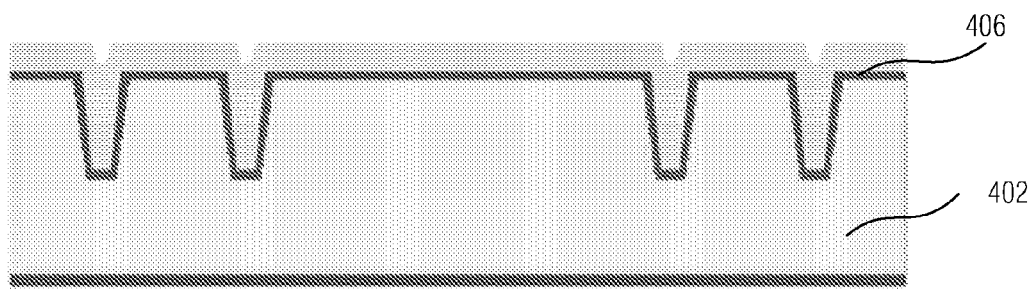
FIG. 4E illustrates the die after removing the film from a bottom side of the grown oxide, according to an example.

FIG. 4E illustrates the die after removing the film from a bottom side 410 of the grown oxide, according to an example. An example includes removing the film from a bottom side includes etching the poly silicon film. An example comprises chemical-mechanical planarization of the film.

Figure 4F:
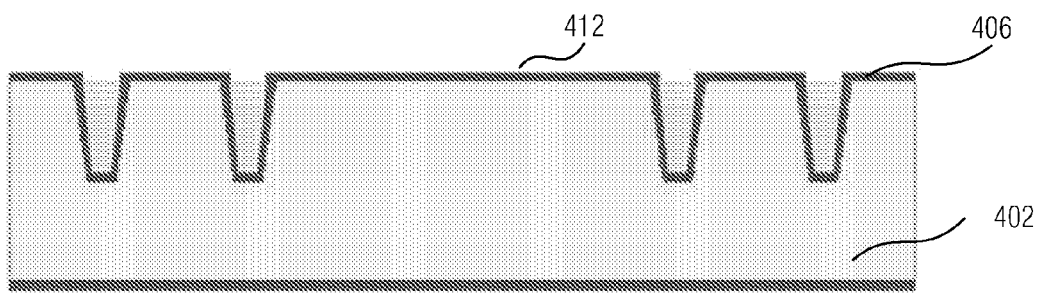
FIG. 4F illustrates the die after removing the film from a top side of the grown oxide, according to an example.

FIG. 4F illustrates the die after removing the film from a top side of the grown oxide, according to an example. An example includes etching the poly silicon film. An example includes removing the film with chemical-mechanical planarization of the film. In an example, oxide grown on the top of the die is exposed.

Figure 4G:
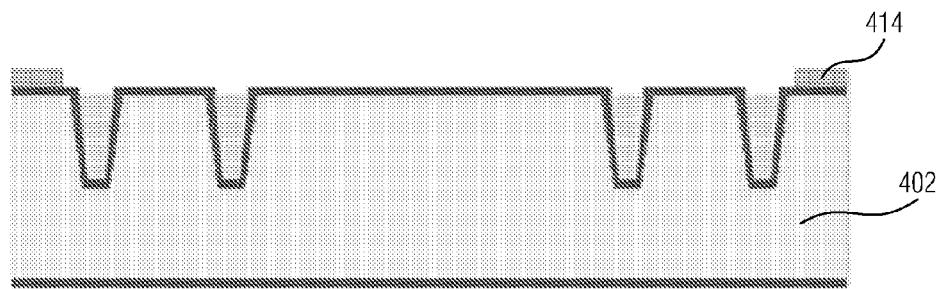
FIG. 4G illustrates the die after disposing a mask on the top side of the grown oxide, according to an example.

FIG. 4G illustrates the die after disposing a mask 414 on the top side of the grown oxide, according to an example. An example includes applying resist to the top side of the grown oxide.

Figure 4H:
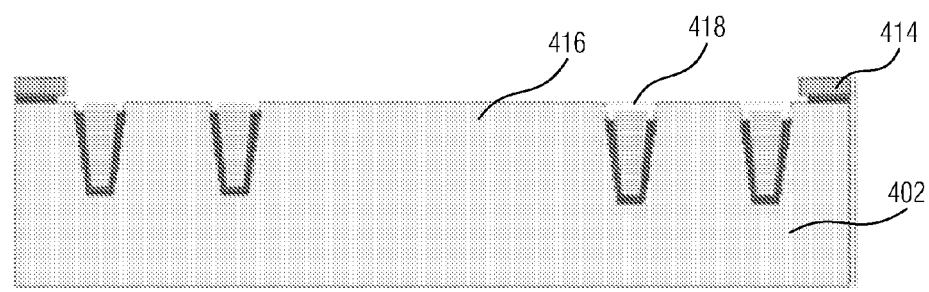
FIG. 4H illustrates the die after disposing the mask, buffered oxide etching the grown oxide

FIG. 4H illustrates the die after disposing the mask, buffered oxide etching the grown oxide. In an example, the etching exposes a top side of the die 402. In an example, the etching minimally affects the mask 414.

Figure 4I:
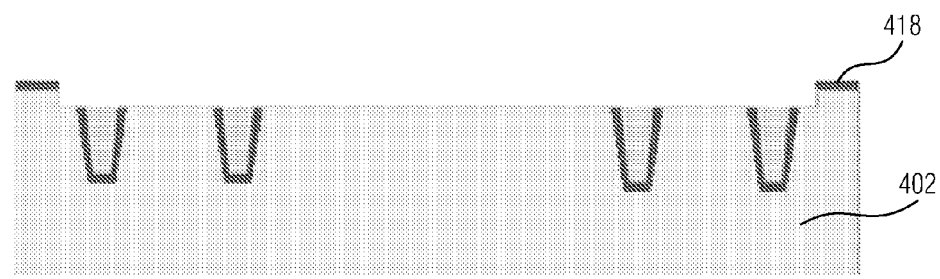
FIG. 4I illustrates the die after buffered oxide etching, dry etching via recesses, according to an example.

FIG. 4I illustrates the die after buffered oxide etching and dry etching via recesses 418, according to an example. In an example, after buffered oxide etching, dry etching via recesses includes DRIE. An example is included wherein after buffered oxide etching, dry etching via recesses includes dry etching with reactive ion etching in SF6 plasma. In an example, dry etching via recesses includes dry etching to a level below a bond surface of the first wafer. In an example, the etching removes a portion of the die. An example is included wherein stripping the grown oxide includes stripping the grown oxide with buffered oxide etching. An example is included wherein stripping the grown oxide to form a bottom portion of a silicon die includes buffered oxide etching ("BOE") the bottom silicon die port. An example is included wherein etching the bottom silicon die port includes applying a mask over a bottom portion of the silicon die and etching over the mask.

Figure 4J:
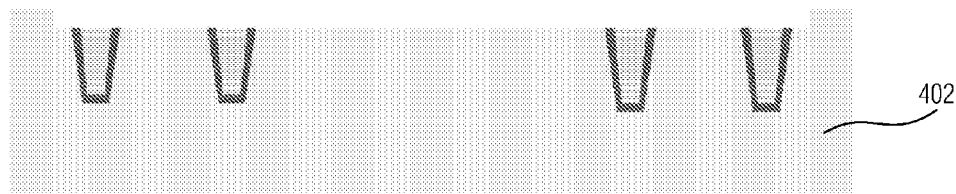
FIG. 4J illustrates the die after dry etching the via recesses, removing the mask, according to an example.
Figure 4K:
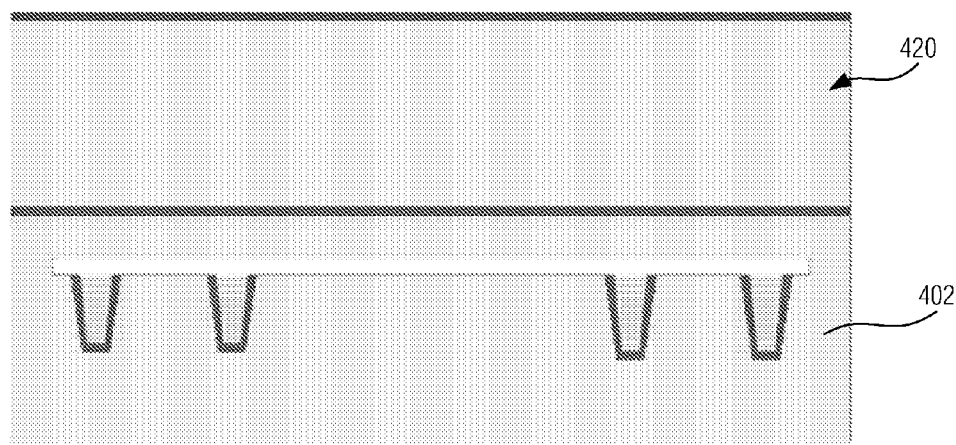
FIG. 4K illustrates the die after coupling the top portion of a die out of a silicon on insulator layer to a via layer and coupling the top portion of the silicon die to the bottom portion of the silicon die to define a cavity between the top portion of the silicon die and the bottom portion of the silicon die

FIG. 4J illustrates the die after dry etching the via recesses, removing the mask 414, according to an example. FIG. 4K illustrates the die after coupling the top portion 420 of a die out of a silicon on insulator layer to a via layer and coupling the top portion of the silicon die to the bottom portion of the silicon die to define a cavity between the top portion of the silicon die and the bottom portion of the silicon die.

Figure 4L:
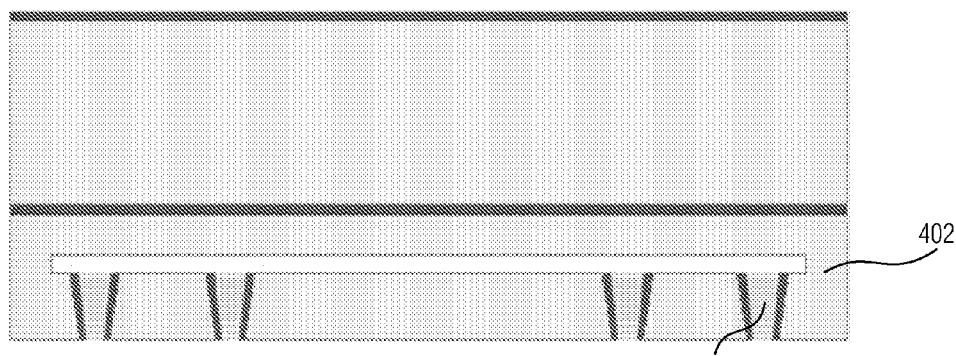
FIG. 4L illustrates the die after excising the bottom portion, according to an example.

FIG. 4L illustrates the die after excising the bottom portion, according to an example. An example is included wherein excising the bottom portion comprises chemical-mechanical planarization of the bottom portion. In the example, the excising exposes one or more via 422.

Figure 4M:
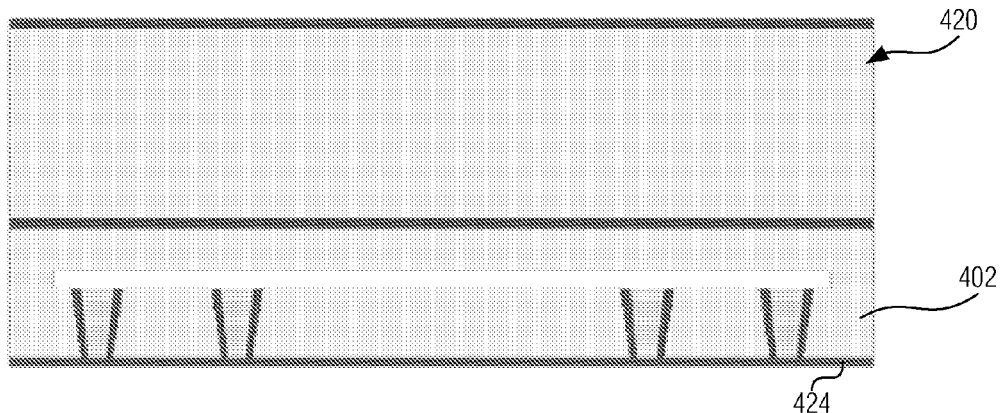
FIG. 4M illustrates the die after growing dielectric onto the excised bottom portion, according to an example.

FIG. 4M illustrates the die after growing dielectric 424 onto the excised bottom portion, according to an example. An example is included wherein growing dielectric onto the excised bottom portion includes growing a dielectric onto the silicon die, over vias.

Figure 4N:
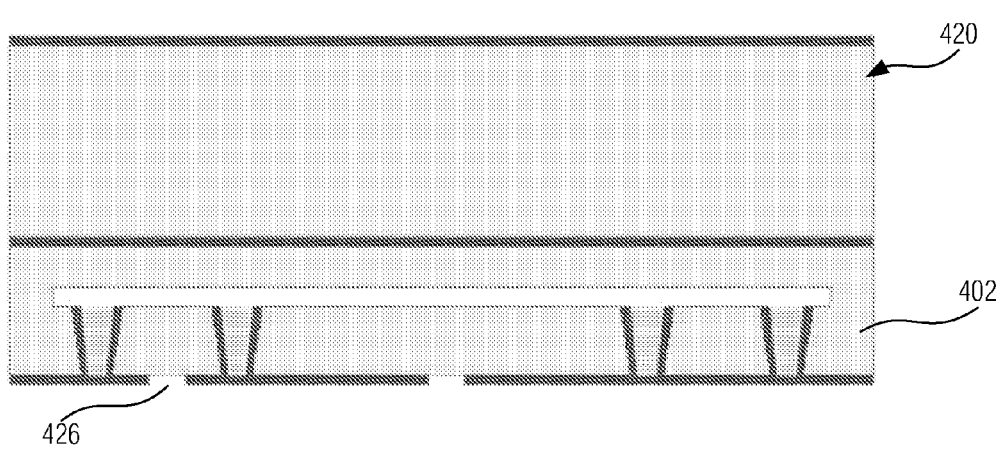
FIG. 4N illustrates the die after etching a pattern into the dielectric on the excised bottom portion, according to an example.

FIG. 4N illustrates the die after etching a pattern 426 into the dielectric on the excised bottom portion, according to an example. An example is included wherein etching a pattern into the dielectric on the excised bottom portion comprises applying a mask to the dielectric and etching the dielectric. An example is included wherein etching a pattern into the dielectric on the excised bottom portion comprises breaking electrical communication between at least two via disposed through the bottom portion.

Figure 4O:
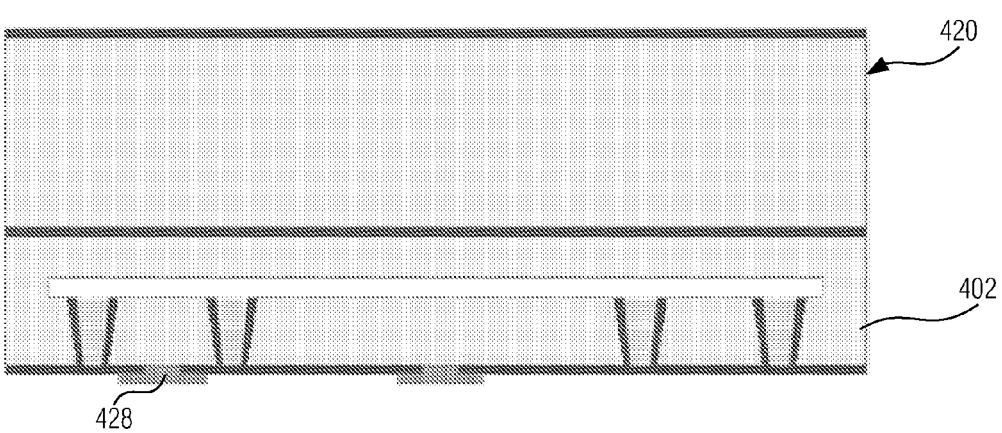
FIG. 4O illustrates the die after depositing a conductor into the pattern, according to an example.

FIG. 4O illustrates the die after depositing a conductor 428 into the pattern, according to an example. An example is included wherein etching the top silicon die port includes applying a mask over a top portion of the silicon die and etching over the mask.

Figure 4P:
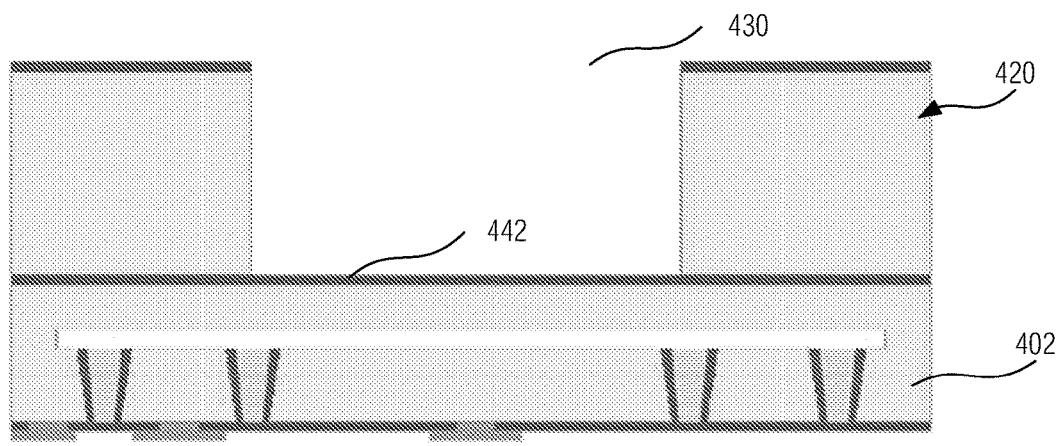
FIG. 4P illustrates the die after etching a top silicon port into the top portion, according to an example.

FIG. 4P illustrates the die after etching a top silicon port 430 into the top portion, according to an example. An example is included wherein etching the top silicon die port includes deep reactive-ion etching ("DRIE") etching the top silicon die port.

Figure 4Q:
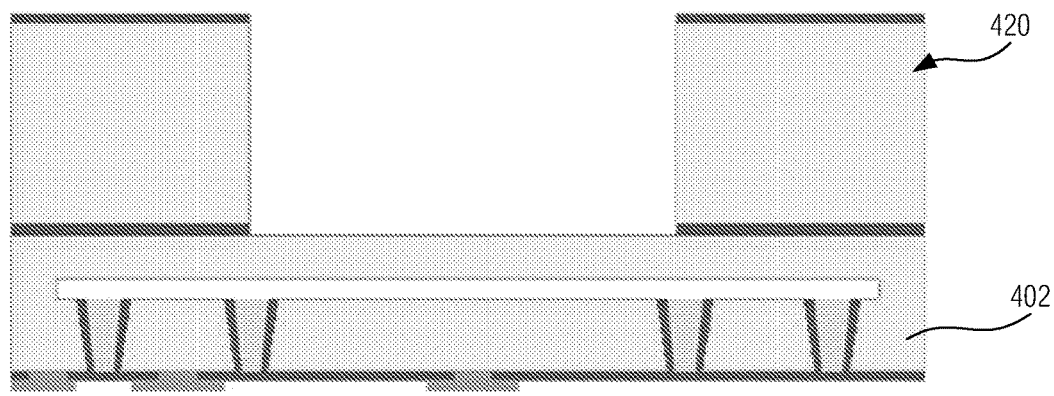
FIG. 4Q illustrates the die after etching grown oxide from inside the top silicon port, according to an example.

FIG. 4Q illustrates the die after etching grown oxide 442 from inside the top silicon port, according to an example. An example is included wherein etching grown oxide from inside the top silicon port includes reactive-ion-etching.

Additional Notes

The present subject matter may be described by way of several examples. Example 1 optionally includes a silicon die including a vibratory diaphragm, the die having a silicon die top opposite a silicon die bottom, with a top silicon die port extending from the silicon die top through the silicon die to a top of the vibratory diaphragm, and with a bottom silicon die port extending from the silicon die bottom to a bottom of the vibratory diaphragm, wherein the bottom silicon die port has a cross sectional area that is larger than a cross-sectional area of the top silicon die port and a capacitor electrode disposed along a bottom of the silicon die, across the bottom silicon die port, the capacitor electrode including a first signal generation portion that is coextensive with the top silicon die port, and a second signal generation portion surrounding the first portion.

Example 2 optionally includes example 1, wherein the top silicon die port has a circular cross-section.

Example 3 optionally includes example 2, wherein the bottom silicon die port has a circular cross section.

Example 4 optionally includes example 1, wherein the capacitor electrode is a layer that defines a cavity including the bottom silicon die port.

Example 5 optionally includes example 4, wherein the cavity is configured to be sealed under vacuum relative to an atmosphere to which the vibratory diaphragm is exposed.

Example 6 optionally includes example 1, wherein the silicon die is comprised of a bottom portion including the vibratory diaphragm, and a top portion joined to the bottom portion.

Example 7 optionally includes example 6, wherein the top portion of the silicon die is joined to the bottom portion of the silicon die at a layer including silicon dioxide.

Example 8 optionally includes example 1, wherein the first signal generation portion is configured to provide an absolute pressure signal.

Example 9 optionally includes example 8, wherein the second signal generation portion is configured to provide a reference signal.

Example 10 optionally includes example 9, wherein the reference signal includes information associated with one of temperature, pressure and electrical charge.

Example 11 optionally includes example 10, wherein the reference signal includes information associated with pressure.

Example 12 optionally includes example 1, wherein the capacitor electrode is formed of a single wafer.

Example 13 optionally includes example 12, wherein the single wafer is sealed against the bottom silicon port.

Example 14 optionally includes example 1, wherein the vibratory diaphragm is approximately 13 micrometers thick.

Example 15 optionally includes example 14, wherein there is an approximately 10 micrometer gap between the first signal generation portion and the second signal generation portion.

Example 16 optionally includes example 15, wherein the capacitor electrode is approximately 1 micrometer away from the vibratory diaphragm.

Example 17 optionally includes example 16, wherein the first signal generation portion defines a circle approximately 300 micrometers in diameter. Example 18 optionally includes example 17, wherein the second signal generation portion defines an annulus approximately 460 micrometers at the outer diameter.

Example 19 optionally includes example 16, wherein the area of the first signal generation portion is approximately 0.09 millimeters squared. Example 20 optionally includes example 19, wherein the first signal generation portion has a capacitance of approximately 0.8 picofarads.

Example 21 optionally includes example 1, wherein a capacitance of the first signal generation portion is greater than a capacitance of the second signal generation portion.

Example 22 optionally includes example 21, wherein a capacitance of the first signal generation portion is 1000 times greater than a capacitance of the second signal generation portion.

Example 23 optionally includes example 1, comprising a bond metal to bond the capacitor electrode to the silicon die.

Example 24 optionally includes example 23, wherein the bond metal includes at least one of a group including aluminum-germanium, gold-tin and copper.

Example 25 optionally includes example 24, wherein the bond metal is copper. Example 26 optionally includes example 23, wherein the capacitor electrode is formed of the bond metal.

Example 27 optionally includes example 26, wherein the bond metal, the first signal generation portion and the second signal generation portion are of approximately the same thickness.

Example 28 optionally includes example 1, wherein the capacitor electrode is disposed on a substrate.

Example 29 optionally includes example 28, wherein the substrate includes an integrated circuit.

Example 30 optionally includes example 29, wherein the integrated circuit is an application specific integrated circuit ("ASIC").

Example 31 optionally includes example 30, wherein the capacitor electrode is physically and electrically coupled to electronics of the ASIC.

Example 32 optionally includes example 31, wherein the capacitor electrode and the bottom silicon die port define a cavity configured to maintain a vacuum imparted through a diffused underpass of the substrate.

Example 33 optionally includes example 29, wherein the substrate is encompassed at least partially by an overmold.

Example 34 optionally includes example 33, wherein the silicon die is physically separated from the overmold.

Example 35 optionally includes example 29, wherein the substrate includes at least one through-silicon-via physically and electrically coupled to the capacitor electrode.

Example 36 optionally includes example 29, wherein the capacitor electrode is wafer bonded onto the substrate.

Example 37 optionally includes example 29, wherein the substrate includes a via wafer.

Example 38 optionally includes example 37, wherein the via wafer is coupled to an integrated circuit wafer.

Example 39 optionally includes example 38, wherein the integrated circuit wafer includes an application specific integrated circuit.

Example 40 optionally includes example 38, wherein the via wafer is bumped onto the integrated circuit wafer with interconnects.

Example 41 optionally includes example 40, comprising a seal disposed between the via wafer and the integrated circuit wafer, outside the interconnects.

Example 42 optionally includes example 40, wherein the integrated circuit includes solder bumps to be solder to additional electronics.

Example 43 optionally includes example 1, comprising a differential circuit coupled to the first signal generation portion and the second signal generation portion and configured to measure a signal difference between the first signal generation portion and the second signal generation portion to provide a capacitance differential signal.

Example 44 optionally includes example 1, wherein the capacitor electrode is formed by the process comprising fusion bonding to the silicon die.

Example 45 optionally includes example, comprising forming a top portion of a silicon die with a silicon die port extending through to a vibratory membrane, forming a bottom portion of the silicon die with vias extending through, coupling the top portion to the bottom portion to define a cavity, forming a capacitor electrode onto the bottom of the coupled top portion and bottom portion, the capacitor electrode extending over at least one via, and forming a first signal generation portion in the capacitor electrode, coextensive with the top silicon die port, and forming a second signal generation portion in the capacitor electrode extending around the first signal generation portion.

Example 46 optionally includes example 45, wherein forming the bottom portion includes etching a first wafer to include via openings, growing an oxide on the etched portions of the first wafer, depositing a film onto the grown oxide, removing the film from a bottom side of the grown oxide, removing the film from a top side of the grown oxide, disposing a mask on the top side of the grown oxide, after disposing the mask, buffered oxide etching the grown oxide, after buffered oxide etching, dry etching via recesses, after dry etching the via recesses, removing the mask, and stripping the grown oxide to form a bottom portion of a silicon die.

Example 47 optionally includes example 46, wherein etching the first wafer includes etching a double side polished wafer that is 725 micrometers thick.

Example 48 optionally includes example 46, wherein etching the first wafer includes pattern and deep reactive-ion etching ("DRIE") etching via openings.

Example 49 optionally includes example 46, wherein growing an oxide on the first wafer includes growing a 1 micrometer thermal oxide on the first wafer.

Example 50 optionally includes example 46, wherein depositing a film includes depositing a conformal poly silicon film.

Example 51 optionally includes example 50, wherein removing the film from a bottom side includes etching the poly silicon film.

Example 52 optionally includes example 50, wherein removing the film from a bottom side comprises chemical-mechanical planarization of the film. Example 53 optionally includes example 50, wherein removing the film from a top side includes etching the poly silicon film.

Example 54 optionally includes example 50, wherein removing the film from a top side comprises chemical-mechanical planarization of the film.

Example 55 optionally includes example 46, wherein disposing a mask on the top side of the grown oxide comprises applying resist to the top side of the grown oxide.

Example 56 optionally includes example 46, wherein after buffered oxide etching, dry etching via recesses includes dry etching with DRIE.

Example 57 optionally includes example 46, wherein after buffered oxide etching, dry etching via recesses includes dry etching with reactive ion etching in SF6 plasma.

Example 58 optionally includes example 46, wherein after buffered oxide etching, dry etching via recesses includes dry etching below a bond surface of the first wafer.

Example 59 optionally includes example 46, wherein stripping the grown oxide includes stripping the grown oxide with buffered oxide etching.

Example 60 optionally includes example 46, wherein stripping the grown oxide to form a bottom portion of a silicon die includes buffered oxide etching ("BOE") the bottom silicon die port. Example 61 optionally includes example 60, wherein etching the bottom silicon die port includes applying a mask over a bottom portion of the silicon die and etching over the mask.

Example 62 optionally includes example 46, wherein coupling the top portion to the bottom portion to define a cavity includes coupling the top portion of a die out of a silicon on insulator layer to a via layer, and coupling the top portion of the silicon die to the bottom portion of the silicon die to define a cavity between the top portion of the silicon die and the bottom portion of the silicon die.

Example 63 optionally includes example 46, wherein forming a capacitor electrode onto the bottom of the coupled top portion and bottom portion, the capacitor electrode extending over at least one via includes excising the bottom portion, and growing dielectric onto the excised bottom portion.

Example 64 optionally includes example 63, wherein excising the bottom portion comprises chemical-mechanical planarization of the bottom portion.

Example 65 optionally includes example 63, wherein growing dielectric onto the excised bottom portion includes growing a dielectric onto the silicon die, over vias.

Example 66 optionally includes example 46, wherein forming a first signal generation portion in the capacitor electrode, coextensive with the top silicon die port and forming a second signal generation portion in the capacitor electrode extending around the first signal generation portion includes etching a pattern into the dielectric on the excised bottom portion, and depositing a conductor into the pattern.

Example 67 optionally includes example 66, wherein etching a pattern into the dielectric on the excised bottom portion comprises applying a mask to the dielectric and etching the dielectric.

Example 68 optionally includes example 66, wherein etching a pattern into the dielectric on the excised bottom portion comprises breaking electrical communication between at least two via disposed through the bottom portion.

Example 69 optionally includes example 46, wherein forming a top portion of a silicon die with a silicon die port extending through to a vibratory membrane includes etching a top silicon port into the top portion, and etching grown oxide from inside the top silicon port.

Example 70 optionally includes example 69, wherein etching the top silicon die port includes applying a mask over a top portion of the silicon die and etching over the mask.

Example 71 optionally includes example 69, wherein etching the top silicon die port includes deep reactive-ion etching ("DRIE") etching the top silicon die port.

Example 72 optionally includes example 69, wherein etching grown oxide from inside the top silicon port includes reactive-ion-etching.

In Example 73, a system or apparatus can include, or can optionally be combined with any portion or combination of any portions of any one or more of Examples 1-44 to include, means for performing any one or more of the functions of Examples 45-72, or a machine-readable medium including instructions that, when performed by a machine, cause the machine to perform any one or more of the functions of Examples 45-72.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a silicon die including a vibratory diaphragm, the silicon die having a silicon die top opposite a silicon die bottom, with a top silicon die port extending from the silicon die top through the silicon die to a top of the vibratory diaphragm, and with a bottom silicon die port extending from the silicon die bottom to a bottom of the vibratory diaphragm, wherein the bottom silicon die port has a cross sectional area that is larger than a cross-sectional area of the top silicon die port;
   a capacitor electrode layer disposed along a bottom of the silicon die and across the bottom silicon die port, the capacitor electrode layer including:
      a first electrode included in a first micro-electromechanical (MEMs) capacitor, the first electrode being coextensive with the top silicon die port; and
      a second electrode included in a second MEMs capacitor, the second electrode being coplanar with and surrounding the first electrode.

2. The apparatus of claim 1, wherein the capacitor electrode layer is a layer that defines a cavity including the bottom silicon die port.

3. The apparatus of claim 2, wherein the cavity is configured to be sealed under vacuum relative to an atmosphere to which the vibratory diaphragm is exposed.

4. The apparatus of claim 1, wherein the silicon die is comprised of a bottom portion including the vibratory diaphragm, and a top portion joined to the bottom portion.

5. The apparatus of claim 1, wherein a capacitance of the first MEMs capacitor is greater than a capacitance of the second MEMs capacitor.

6. The apparatus of claim 5, wherein a capacitance of the first MEMS capacitor is 1000 times greater than a capacitance of the second MEMs capacitor.

7. An apparatus comprising:
   a silicon die including a vibratory diaphragm, the silicon die having a silicon die top opposite a silicon die bottom, with a top silicon die port extending from the silicon die top through the silicon die to a top of the vibratory diaphragm, and with a bottom silicon die port extending from the silicon die bottom to a bottom of the vibratory diaphragm, wherein the bottom silicon die port has a cross sectional area that is larger than a cross-sectional area of the top silicon die port; and
   a capacitor electrode layer disposed along a bottom of the silicon die and across the bottom silicon die port, the capacitor electrode layer including:
      a first electrode included in a first micro-electromechanical (MEMs) capacitor, the first electrode being coextensive with the top silicon die port; and
      a second electrode included in a second MEMs capacitor, the second electrode being coplanar with and surrounding the first electrode, the capacitor electrode being disposed on a substrate, the substrate including an integrated circuit.

8. The apparatus of claim 7, wherein the substrate is encompassed at least partially by an overmold.

9. The apparatus of claim 8, wherein the silicon die is physically separated from the overmold.

10. The apparatus of claim 7, wherein the substrate includes at least one through-silicon-via physically and electrically coupled to the capacitor electrode layer.

11. The apparatus of claim 7, wherein the substrate includes a via wafer, wherein the via wafer is coupled to an integrated circuit wafer, wherein the integrated circuit wafer includes an application specific integrated circuit, wherein the via wafer is coupled to the integrated circuit wafer with solder bump interconnects.

12. The apparatus of claim 11, comprising a seal disposed between the via wafer and the integrated circuit wafer, outside the interconnects.

13. The apparatus of claim 1, comprising a differential circuit coupled to the first electrode and the second electrode and configured to measure a signal difference between the first electrode and the second electrode to provide a capacitance differential signal.

14. A method, comprising:
   forming a top portion of a silicon die with a top silicon die port extending through to a vibratory membrane;
   forming a bottom portion of the silicon die with vias extending through;
   coupling the top portion of the silicon die to the bottom portion of the silicon die to define a cavity; and
   forming a capacitor electrode layer onto a bottom of the coupled top portion of the silicon die and the bottom portion of the silicon die, the capacitor electrode layer extending over at least one via,
   the forming the capacitor electrode layer including:
      forming a first electrode included in a first microelectromechanical (MEMs) capacitor, the first electrode being coextensive with the top silicon die port; and
      forming a second electrode included in a second MEMs capacitor, the second electrode being coplanar with and extending around the first electrode.

15. The method of claim 14, wherein forming the bottom portion of the silicon die includes:
   etching portions of a first wafer to include via openings;

growing an oxide on the etched portions of the first wafer;
depositing a film onto the grown oxide;
removing the film from a bottom side of the grown oxide;
removing the film from a top side of the grown oxide;
disposing a mask on the top side of the grown oxide;
after disposing the mask, buffered oxide etching the grown oxide;
after buffered oxide etching, dry etching via recesses;
after dry etching the via recesses, removing the mask; and
stripping the grown oxide to form the bottom portion of the silicon die.

16. The method of claim 14, wherein coupling the top portion of the silicon die to the bottom portion of the silicon die to define the cavity includes:
coupling the top portion of the silicon die, being a die from a silicon on insulator layer, to a via layer; and
coupling the top portion of the silicon die to the bottom portion of the silicon die to define a cavity between the top portion of the silicon die and the bottom portion of the silicon die.

17. The method of claim 14, wherein forming the capacitor electrode layer includes:
excising the bottom portion of the silicon die; and
growing dielectric on the excised bottom portion of the silicon die.

18. The method of claim 17, wherein forming the first electrode and forming the second electrode includes:
etching a pattern into the dielectric on the excised bottom portion of the silicon die; and
depositing a conductor into the pattern.

19. The method of claim 18, wherein etching the pattern into the dielectric on the excised bottom portion of the silicon die comprises breaking electrical communication between at least two vias disposed through the bottom portion of the silicon die.

20. The method of claim 14, wherein forming the top portion of the silicon die includes:
etching a top silicon port into the top portion of the silicon die; and
etching grown oxide from inside the top silicon port.

* * * * *